(12) United States Patent
Fan et al.

(10) Patent No.: US 12,364,132 B2
(45) Date of Patent: Jul. 15, 2025

(54) DISPLAY SUBSTRATE AND DISPLAY DEVICE

(71) Applicant: BOE TECHNOLOGY GROUP CO., LTD., Beijing (CN)

(72) Inventors: Xing Fan, Beijing (CN); Lujiang Huangfu, Beijing (CN); Hao Gao, Beijing (CN); Qiuhua Meng, Beijing (CN); Hao Zhang, Beijing (CN); Na Li, Beijing (CN); Yansong Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 107 days.

(21) Appl. No.: 17/916,148

(22) PCT Filed: Nov. 16, 2021

(86) PCT No.: PCT/CN2021/130928
§ 371 (c)(1),
(2) Date: Sep. 30, 2022

(87) PCT Pub. No.: WO2022/205933
PCT Pub. Date: Oct. 6, 2022

(65) Prior Publication Data
US 2024/0215367 A1 Jun. 27, 2024

(30) Foreign Application Priority Data
Mar. 31, 2021 (CN) .......................... 202110348040.5

(51) Int. Cl.
*H10K 59/35* (2023.01)
*H10K 59/80* (2023.01)

(52) U.S. Cl.
CPC ......... *H10K 59/353* (2023.02); *H10K 59/805* (2023.02)

(58) Field of Classification Search
CPC ............... H10K 59/353; H10K 59/805; H10K 59/80515; H10K 59/80521; H10K 59/122
See application file for complete search history.

(56) References Cited

U.S. PATENT DOCUMENTS 8,987,767 B2  3/2015  Lee et al.
9,536,931 B2  1/2017  Kim et al.
(Continued)

FOREIGN PATENT DOCUMENTS

CN  101027595 A  8/2007
CN  103219354 A  7/2013
(Continued)

*Primary Examiner* — Tucker J Wright
(74) *Attorney, Agent, or Firm* — Scully, Scott, Murphy & Presser, P.C.

(57) ABSTRACT

A display substrate and a display device are provided. The display substrate includes a base substrate and a first insulation layer. The first insulation layer includes a plurality of first openings, the first opening is configured to expose a first electrode to form an effective light emitting region, at least one effective light emitting region at least partially surrounds at least one island region; a second insulation pattern, the first electrode, a first insulation pattern of the first insulation layer, a light emitting layer and a second electrode are sequentially provided in the island region along a direction facing away from the base substrate, a distance between a portion of the first electrode in the island region and a main surface of the base substrate is greater than a distance between a portion of the first electrode in the effective light emitting region and the main surface of the base substrate.

20 Claims, 9 Drawing Sheets

(56) References Cited

U.S. PATENT DOCUMENTS

| | | | |
|---|---|---|---|
| 9,685,634 B2 | 6/2017 | Huangfu et al. | |
| 2006/0066219 A1* | 3/2006 | Shimoda | H10K 59/1315 |
| | | | 313/500 |
| 2016/0268554 A1 | 9/2016 | Wu et al. | |
| 2017/0271418 A1 | 9/2017 | Li et al. | |
| 2021/0057671 A1 | 2/2021 | Gao et al. | |
| 2021/0296415 A1* | 9/2021 | Huangfu | H10K 50/80 |
| 2021/0408177 A1 | 12/2021 | Fan et al. | |

FOREIGN PATENT DOCUMENTS

| | | | |
|---|---|---|---|
| CN | 104733501 A | 6/2015 | |
| CN | 105552249 A | 5/2016 | |
| CN | 106653800 A | 5/2017 | |
| CN | 108155213 A | 6/2018 | |
| CN | 109920826 A | 6/2019 | |
| CN | 110364555 A | 10/2019 | |
| CN | 110459570 A | 11/2019 | |
| CN | 111223894 A | 6/2020 | |
| CN | 111341814 A | 6/2020 | |
| CN | 215342609 U | 12/2021 | |
| EP | 3018726 A1 | 5/2016 | |

* cited by examiner

DISPLAY SUBSTRATE AND DISPLAY DEVICE

CROSS-REFERENCE TO RELATED APPLICATIONS

This application is a U.S. national phase entry of PCT International Application No. PCT/CN2021/130928, filed on Nov. 16, 2021, which claims priority to Chinese Patent Application No. 202110348040.5 filed on Mar. 31, 2021. The entire disclosure of PCT International Application No. PCT/CN2021/130928 and the entire disclosure of Chinese Patent Application No. 202110348040.5 are hereby incorporated in their entirety as a part of the subject application.

TECHNICAL FIELD

Embodiments of the present disclosure relates to a display substrate and a display device.

BACKGROUND

With the rapid development and application of OLED (Organic Light-emitting Diode) display technology, recent market demand for the display effect of OLED display products has become higher and higher, thus the pixel layout of the OLED display products and the structure of light emitting element becomes more and more diverse.

SUMMARY

At least one embodiment of the disclosure provides a display substrate. The display substrate comprises: a base substrate, comprising a display region, wherein the display region comprises a plurality of pixel units arranged in a plurality of rows and a plurality of columns, each of the pixel units comprises a plurality of sub-pixels, each of the sub-pixels comprises a light emitting element and a sub-pixel driving circuit, the light emitting element comprises a first electrode, a second electrode and a light emitting layer, the first electrode is provided on the base substrate, the second electrode is provided on a side of the first electrode facing away from the base substrate, and the light emitting layer is provided between the first electrode and the second electrode; and a first insulation layer, provided between the first electrode and the light emitting layer, wherein the first insulation layer comprises a plurality of first openings, and the plurality of the first openings are in one-to-one correspondence with the plurality of the sub-pixels, each of the plurality of first openings is configured to expose the first electrode to form an effective light emitting region of the light emitting element, at least one effective light emitting region at least partially surrounds at least one island region; wherein the first insulation layer comprises a first insulation pattern, a second insulation pattern is provided on a side of the first electrode close to the base substrate, the second insulation pattern, the first electrode, the first insulation pattern, the light emitting layer and the second electrode are sequentially provided in the island region along a direction facing away from the base substrate, a distance between a portion of the first electrode in the island region and a main surface of the base substrate in a direction perpendicular to the main surface of the base substrate is greater than a distance between a portion of the first electrode in the effective light emitting region and the main surface of the base substrate in the direction perpendicular to the main surface of the base substrate.

For example, the display substrate provided by at least one embodiment of the disclosure further comprises: a second insulation layer, wherein the second insulation layer is provided on the side of the first electrode close to the base substrate; an orthographic projection of the first insulation pattern on the main surface of the base substrate at least partially overlaps an orthographic projection of the second insulation pattern on the main surface of the base substrate; the first insulation layer and the first insulation pattern are provided in a same layer using a same material, and the second insulation layer and the second insulation pattern are provided in a same layer using a same material.

For example, in the display substrate provided by at least one embodiment of the disclosure, the second insulation layer has a second opening corresponding to the effective light emitting region, and the second opening is provided between an edge of the second insulation layer surrounding the effective light emitting region and an edge of the second insulation pattern; a thickness, in the direction perpendicular to the main surface of the base substrate, of a portion of the second insulation layer in a region where a bottom of the second opening is provided is zero, or the thickness is greater than zero and smaller than a thickness of the second insulation pattern in the direction perpendicular to the main surface of the base substrate.

For example, the display substrate provided by at least one embodiment of the disclosure further comprises: a third insulation layer, wherein the third insulation layer is provided on a side of the second insulation layer close to the base substrate, the third insulation layer has a third insulation pattern in the island region; a distance between the third insulation pattern and the main surface of the base substrate in the direction perpendicular to the main surface of the base substrate is greater than a distance between a portion of the third insulation layer in the effective light emitting region and the main surface of the base substrate in the direction perpendicular to the main surface of the base substrate.

For example, in the display substrate provided by at least one embodiment of the disclosure, a thickness, in the direction perpendicular to the main surface of the base substrate, of the portion of the third insulation layer in the effective light emitting region is smaller than a thickness of a portion of the third insulation layer surrounding the effective light emitting region in the direction perpendicular to the main surface of the base substrate.

For example, in the display substrate provided by at least one embodiment of the disclosure, the second insulation pattern has a side surface provided at an edge of the second insulation pattern, a tangent of the side surface intersects with a plane where the main surface of the base substrate is provided, and an intersection angle is a first angle $\alpha1$; the first electrode has a first sub-portion covering the second insulation pattern; a tangent of a side surface at an edge of the first sub-portion intersects with the plane where the main surface of the base substrate is provided, an intersection angle is a second angle $\alpha2$, and the second angle $\alpha2$ is substantially equal to the first angle $\alpha1$; a value range of the first angle $\alpha1$ is from 15 degrees to 70 degrees.

For example, in the display substrate provided by at least one embodiment of the disclosure, the first insulation pattern comprises at least one insulation pattern sub-portion separated from each other, and the second insulation pattern comprises at least one protrusion; the at least one insulation pattern sub-portion covers at least a portion of the at least one protrusion respectively, and an orthographic projection of the at least one protrusion on the main surface of the base substrate overlaps both an orthographic projection of the at least one insulation pattern sub-portion on the main surface of the base substrate and an orthographic projection of the first sub-portion on the main surface of the base substrate.

For example, in the display substrate provided by at least one embodiment of the disclosure, the orthographic projection of the at least one protrusion on the main surface of the base substrate is within the orthographic projection of the at least one insulation pattern sub-portion on the main surface of the base substrate; in a circumferential direction of the orthographic projection of the at least one protrusion on the main surface of the base substrate, a distance between an edge of the orthographic projection of the at least one insulation pattern sub-portion on the main surface of the base substrate and an edge of the at least one protrusion is substantially same.

For example, in the display substrate provided by at least one embodiment of the disclosure, in the direction perpendicular to the main surface of the base substrate, the at least one protrusion has a maximum thickness H1, a portion of the second insulation layer surrounding the effective light emitting region has a maximum thickness H2, and H1<H2.

For example, in the display substrate provided by at least one embodiment of the disclosure, the maximum thickness H1 of the at least one protrusion ranges from 0.5 microns to 3 microns.

For example, in the display substrate provided by at least one embodiment of the disclosure, the plurality of sub-pixels of the pixel unit are arranged in a row direction, and a maximum size, in the row direction, of the at least one protrusion is greater than or equal to $H1/\tan(\alpha 1)$.

For example, in the display substrate provided by at least one embodiment of the disclosure, a distance between an edge of the orthographic projection of the at least one protrusion on the main surface of the base substrate in the row direction and an edge of a corresponding effective light emitting region in the row direction is substantially same.

For example, in the display substrate provided by at least one embodiment of the disclosure, the plurality of sub-pixels of each of the pixel units comprises a first sub-pixel, a second sub-pixel and at least one third sub-pixel, the second insulation pattern comprises a first protrusion provided in the first sub-pixel, the first insulation pattern comprises a first insulation pattern sub-portion covering the first protrusion, and the effective light emitting region of the first sub-pixel surrounds the first insulation pattern sub-portion along an circumferential direction of the first insulation pattern sub-portion; a shape of a profile of an orthographic projection of the first protrusion on the main surface of the is substantially same as a shape of a profile of an orthographic projection of an edge, facing away from the first protrusion, of the effective light emitting region of the first sub-pixel on the main surface of the base substrate.

For example, in the display substrate provided by at least one embodiment of the disclosure, a maximum size of the effective light emitting region of the first sub-pixel in the column direction is greater than the maximum size thereof in the row direction, a maximum size of the first protrusion of the first sub-pixel in the column direction is greater than the maximum size thereof in the row direction, and a distance between an edge of the orthographic projection of the first protrusion on the main surface of the base substrate in the column direction and an edge of a corresponding effective light emitting region in the column direction is substantially same.

For example, in the display substrate provided by at least one embodiment of the disclosure, the second insulation pattern further comprises a plurality of second protrusions provided in the second sub-pixel, a maximum size of the effective light emitting region of the second sub-pixel along the column direction is larger than a maximum size of the effective light emitting region of the second sub-pixel along the row direction, the plurality of second protrusions are arranged at intervals along the column direction; the first insulation pattern further comprises second insulation pattern sub-portions covering the plurality of second protrusions respectively, and the effective light emitting region of the second sub-pixel surrounds the second insulation pattern sub-portion along a circumferential direction of the second insulation pattern sub-portion; the effective light emitting region comprises portions provided between the plurality of second protrusions.

For example, in the display substrate provided by at least one embodiment of the disclosure, the at least one third sub-pixel comprises two third sub-pixels spaced from each other in the column direction, and the second insulation pattern further comprises a third protrusion in each third sub-pixel, the first insulation pattern further comprises a third insulation pattern sub-portion covering the third protrusion; the effective light emitting region of the third sub-pixel surrounds a part of an edge of the third protrusion, and the effective light emitting region of the third sub-pixel has a notch, and an orthographic projection of the notch on the main surface of the base substrate at least partially overlaps an orthographic projection of the third protrusion on the main surface of the base substrate.

For example, in the display substrate provided by at least one embodiment of the disclosure, the third protrusions in the two third sub-pixels are connected and integral with the second insulation layer in an interval region provided between the two third sub-pixels, the third insulation pattern sub-portion is connected and integral with the first insulation layer in the interval region between the two third sub-pixels.

For example, in the display substrate provided by at least one embodiment of the disclosure, the notches of the effective light emitting regions of the two third sub-pixels are respectively provided at adjacent edges of the two third sub-pixels, and the notches are substantially symmetrical about a line extending in the row direction.

For example, in the display substrate provided by at least one embodiment of the disclosure, the first sub-pixel is a red sub-pixel, the second sub-pixel is a blue sub-pixel, and the third sub-pixel is a green sub-pixel pixel; at least one island region is provided in the first sub-pixel, and the island region is not provided in the second sub-pixel and the third sub-pixel.

For example, in the display substrate provided by at least one embodiment of the disclosure, a portion of the second insulation layer surrounding an edge of the effective light emitting region has a side surface, and a tangent of the side surface intersects with a plane where the main surface of the base substrate is provided, and an intersecting angle is a third angle $\alpha 3$.

For example, in the display substrate provided by at least one embodiment of the disclosure, the first electrode further has a second sub-portion covering the side surface of the second insulation layer, and a tangent of the second sub-portion intersects with the plane where the main surface of the base substrate is provided, and an intersection angle is a fourth angle $\alpha 4$; the third angle $\alpha 3$ is substantially same as the fourth angle $\alpha 4$; the third angle $\alpha 3$ ranges from 40 degrees to 60 degrees.

For example, in the display substrate provided by at least one embodiment of the disclosure, each of the sub-pixels further comprises a transition electrode, and the transition electrode is connected to the sub-pixel driving circuit through a first via hole in the third insulation layer and is connected to the first electrode through a second via hole in the second insulation layer; the transition electrode comprises a transparent conductive oxide material.

For example, the display substrate provided by at least one embodiment of the disclosure further comprises: a buffer layer, wherein, the buffer layer is provided between the second insulation layer and the third insulation layer; a material of the buffer layer comprises silicon oxide or silicon nitride.

At least one embodiment of the disclosure provides a display device, and the display device comprises the display substrate as described above.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, the technical terms or scientific terms here should be of general meaning as understood by those ordinarily skilled in the art. In the descriptions and claims of the present disclosure, expressions such as "first", "second" and the like do not denote any order, quantity, or importance, but rather are used for distinguishing different components. Similarly, expressions such as "a/an" or "the" or the like do not denote quantitative limitation, but rather indicate there is at least one. Expressions such as "include" or "comprise" and the like denote that elements or objects appearing before the words of "include" or "comprise" cover the elements or the objects enumerated after the words of "include" or "comprise" or equivalents thereof, not exclusive of other elements or objects. For convenience of description, in some drawings, expressions such as "up", "down", "front" and "back" and the like are used. In the embodiments of the present disclosure, a vertical direction is from top to bottom, the vertical direction is a gravity direction, a horizontal direction is perpendicular to the vertical direction, and the horizontal direction from right to left is a direction from front to back.

Figure 1:
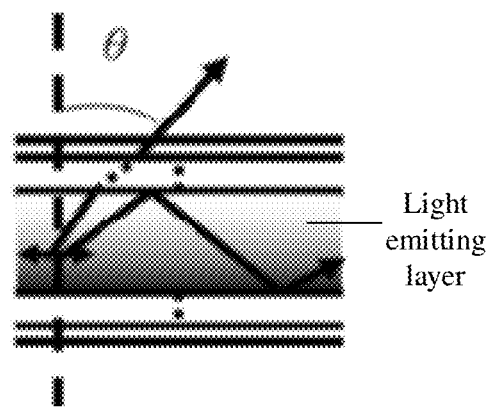
FIG. 1 is a schematic view of an optical path of light emitted by a light emitting layer of a display substrate.

FIG. 1 is a schematic view of an optical path of light emitted by a light emitting layer of a display substrate.

As shown in FIG. 1, because the refractive index of the material of the light emitting layer of the display substrate is about 1.8, which is much higher than the refractive index of the air, only a very small part of the light emitted by the light emitting layer has an emergence angle smaller than the critical angle of total reflection, and thus only the very small part of the light is able to directly output from a light-emitting surface, most of the light is totally reflected at an interface and, for example, is transmitted in a film in waveguide mode. Light transmitted in waveguide mode is either lost during the transmission procedure, or dissipated uncontrollably at edges of the untreated film (for example, at waveguide terminals), and thus an effective display irradiation cannot be obtained. At present, the display effect of a plurality of sub-pixels of the display substrate needs to achieve a balance between the white-light color shift and the luminance decay (L-decay,) for the light emitted by the plurality of sub-pixels.

At least one embodiment of the present disclosure provides a display substrate, the display substrate includes: a base substrate and a first insulation layer. The base substrate includes a display region, the display region includes a plurality of pixel units arranged in a plurality of rows and a plurality of columns, each of the pixel units includes a plurality of sub-pixels, each of the sub-pixels includes a light emitting element and a sub-pixel driving circuit, the light emitting element includes a first electrode, a second electrode and a light emitting layer, the first electrode is provided on the base substrate, the second electrode is provided on a side of the first electrode facing away from the base substrate, the light emitting layer is provided between the first electrode and the second electrode; the first insulation layer is provided between the first electrode and the light emitting layer, the first insulation layer includes a plurality of first openings, and the plurality of the first openings are in one-to-one correspondence with the plurality of the sub-pixels, the first opening is configured to expose the first electrode to form an effective light emitting region of the light emitting element, at least one effective light emitting region at least partially surrounds at least one island region; the first insulation layer includes a first insulation pattern, a second insulation pattern is provided on a side of the first electrode close to the base substrate, the second insulation pattern, the first electrode, the first insulation pattern, the light emitting layer and the second electrode are sequentially provided in each island region along a direction facing away from the base substrate, a distance between a portion of the first electrode in the island region and a main surface of the base substrate in a direction perpendicular to the main surface of the base substrate is greater than a distance between a portion of the first electrode in the effective light emitting region and the main surface of the base substrate in the direction perpendicular to the main surface of the base substrate.

At least one embodiment of the present disclosure further provides a display device including the above-mentioned display substrate.

In the display substrate and the display device provided in the above-mentioned embodiments, the display substrate is configured to enable the distance between a portion of the first electrode in the island region and the main surface of the base substrate in the direction perpendicular to the main surface of the base substrate to be greater than the distance between a portion of the first electrode in the effective light emitting region and the main surface of the base substrate in the direction perpendicular to the main surface of the base substrate, so that the luminance decay and the white-light color shift of the plurality of sub-pixels are more balanced, thereby increasing viewing angle characteristics of white light on the basis of ensuring the color gamut, and in turn meeting product requirements.

The embodiments and examples of the present disclosure will be described in detail below with reference to the accompanying drawings.

Figure 2:
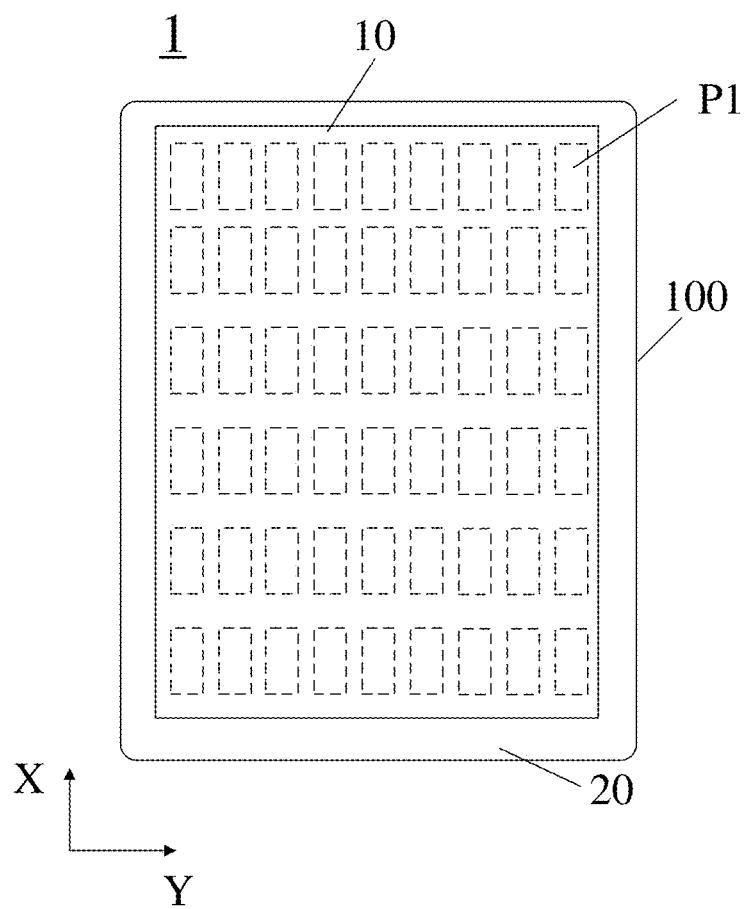
FIG. 2 is a schematic view of a display substrate according to at least one embodiment of the present disclosure.
Figure 3:
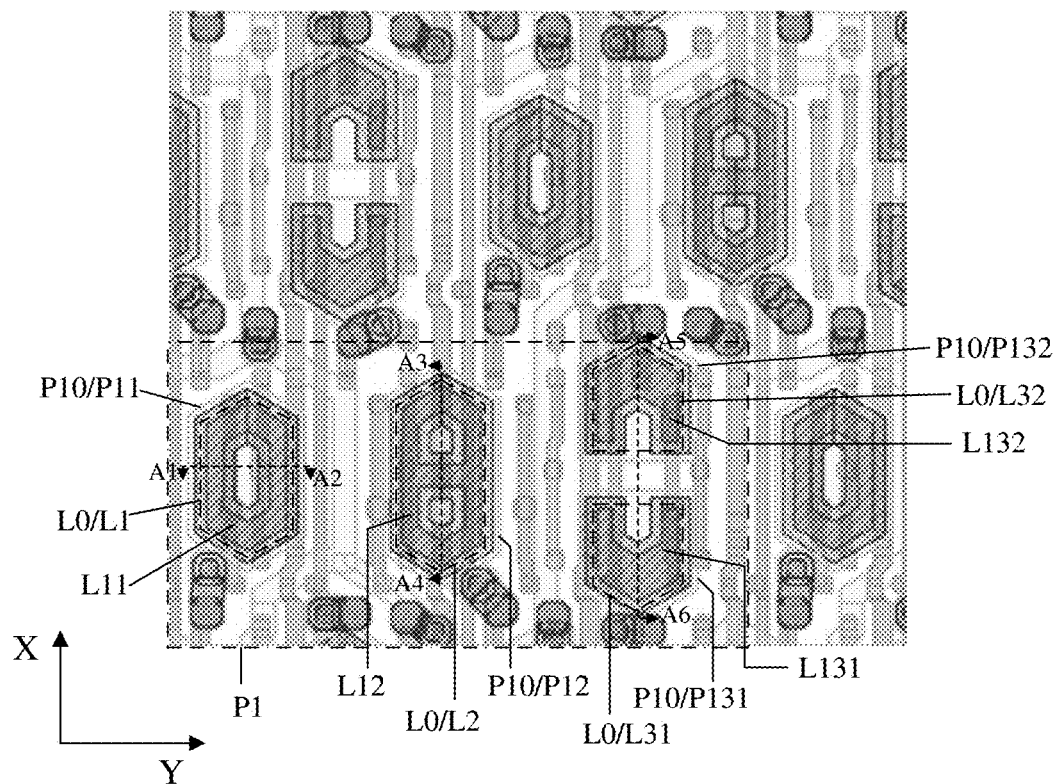
FIG. 3 is a planar layout schematic view of a partial structure of a pixel unit according to at least one embodiment of the present disclosure.

FIG. 2 is a schematic view of a display substrate according to at least one embodiment of the present disclosure. FIG. 3 is a planar layout schematic view of a partial structure of a pixel unit according to at least one embodiment of the present disclosure.

For example, in some embodiments, as shown in FIG. 2 and FIG. 3, the display substrate 1 includes a base substrate 100. The base substrate 100 includes a display region 10 and a peripheral region 20 at least partially surrounding the display region 10. The display region 10 includes a plurality of pixel units P1, which are arranged in a plurality of rows and a plurality of columns, and a plurality of light emitting regions L0 (shown in FIG. 3). Each pixel unit P1 includes a plurality of sub-pixels P10, and each sub-pixel P10 includes a light emitting element and a sub-pixel driving circuit. The light emitting element includes a first electrode, a second electrode and a light emitting layer, and the plurality of light emitting regions L0 are in one-to-one correspondence with a plurality of light emitting elements of the plurality of sub-pixels P10. For example, each pixel unit P1 includes a first sub-pixel P11, a second sub-pixel P12 and at least one third sub-pixel P13. For example, it is taken as an example that the at least one third sub-pixel P13 includes the third sub-pixel P131 and the third sub-pixel P132. For example, the light emitting element of the first sub-pixel P11 corresponds to the light emitting region L1, the light emitting element of the second sub-pixel P12 corresponds to the light emitting region L2, the light emitting element of the third sub-pixel P131 corresponds to the light emitting region L31, and the light emitting element of the third sub-pixel P132 correspond to the light emitting region L32.

For example, the base substrate 100 is a glass substrate, a quartz substrate, a metal substrate, a resin substrate, and the like. For example, the material of the base substrate includes an organic material, for example, the organic material includes polyimide, polycarbonate, polyacrylate, polyetherimide, polyethersulfone, polyethylene terephthalate, polyethylene naphthalate or other resin materials; for example, the base substrate 100 is a flexible substrate or a non-flexible substrate, which is not limited in the embodiments of the present disclosure.

For example, in some embodiments, the first sub-pixel P11 is a red sub-pixel (R), the second sub-pixel P12 is a blue sub-pixel (B), and the third sub-pixel P13 is a green sub-pixel (G). That is, in the embodiments of the present disclosure, it is taken as an example that the sub-pixel arrangement of the pixel unit is GGRB, but the present disclosure is not limited thereto.

Figure 4A:
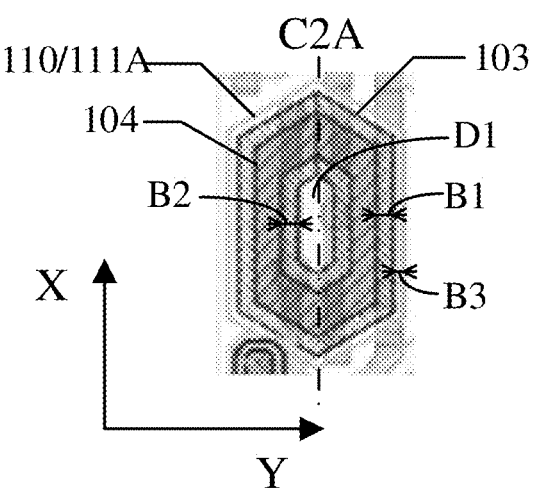
FIG. 4A is a planar layout schematic view of a partial structure of a sub-pixel provided by at least one example of the present disclosure.
Figure 4B:
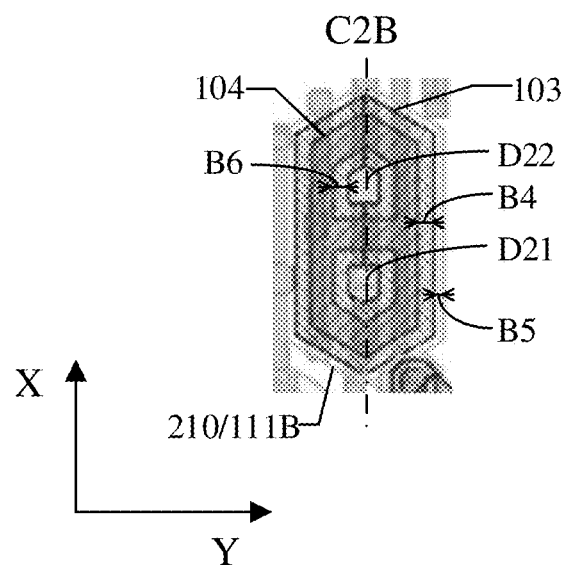
FIG. 4B is a planar layout schematic view of a partial structure of another sub-pixel provided by at least one example of the present disclosure.
Figure 4C:
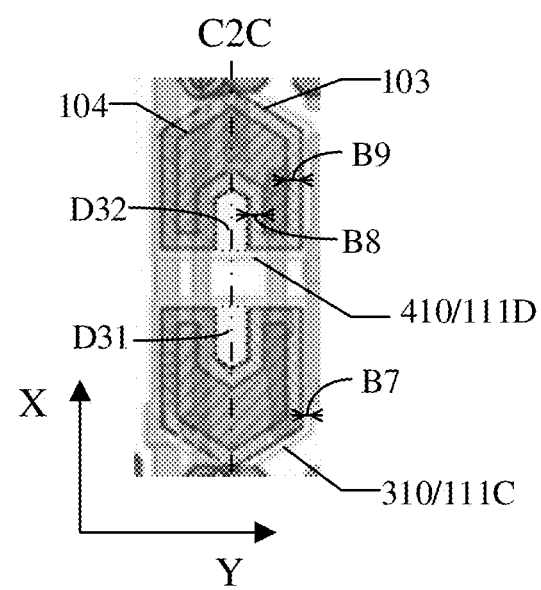
FIG. 4C is a planar layout schematic view of a partial structure of still another sub-pixel provided by at least one example of the present disclosure.
Figure 5:
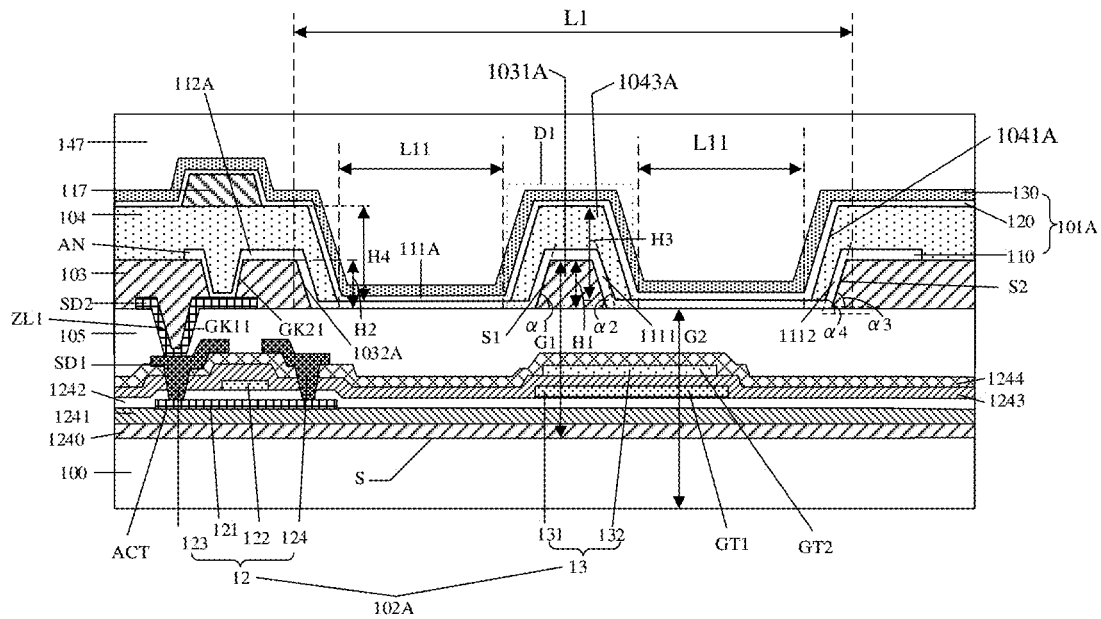
FIG. 5 is a cross-sectional view taken along a line A1-A2 in FIG. 3.
Figure 6:
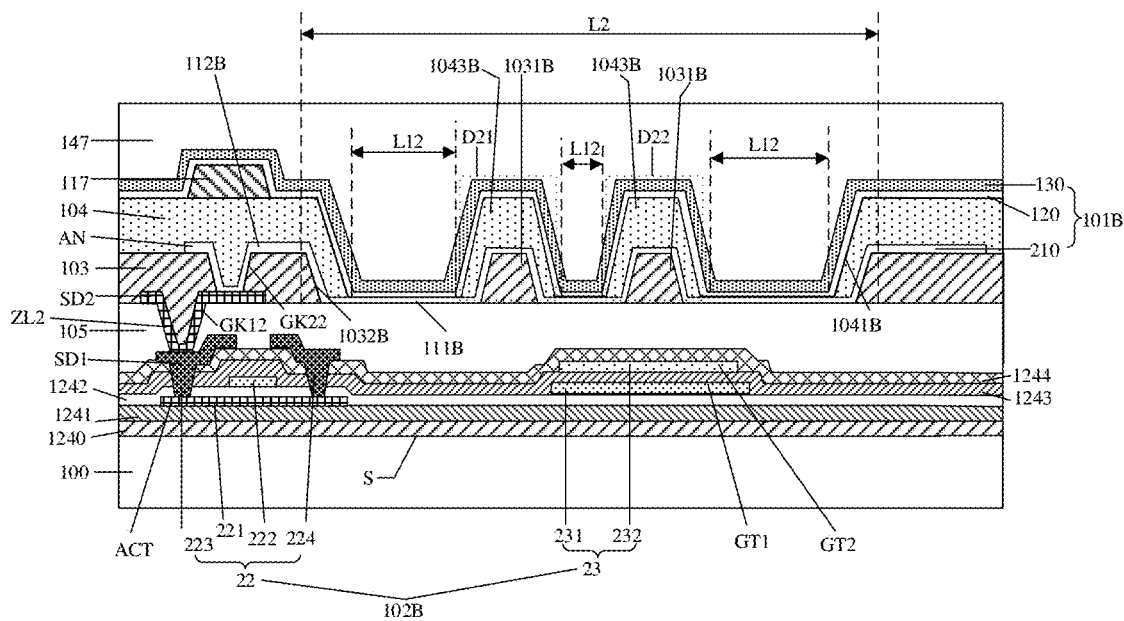
FIG. 6 is a cross-sectional view taken along a line A3-A4 in FIG. 3.
Figure 7:
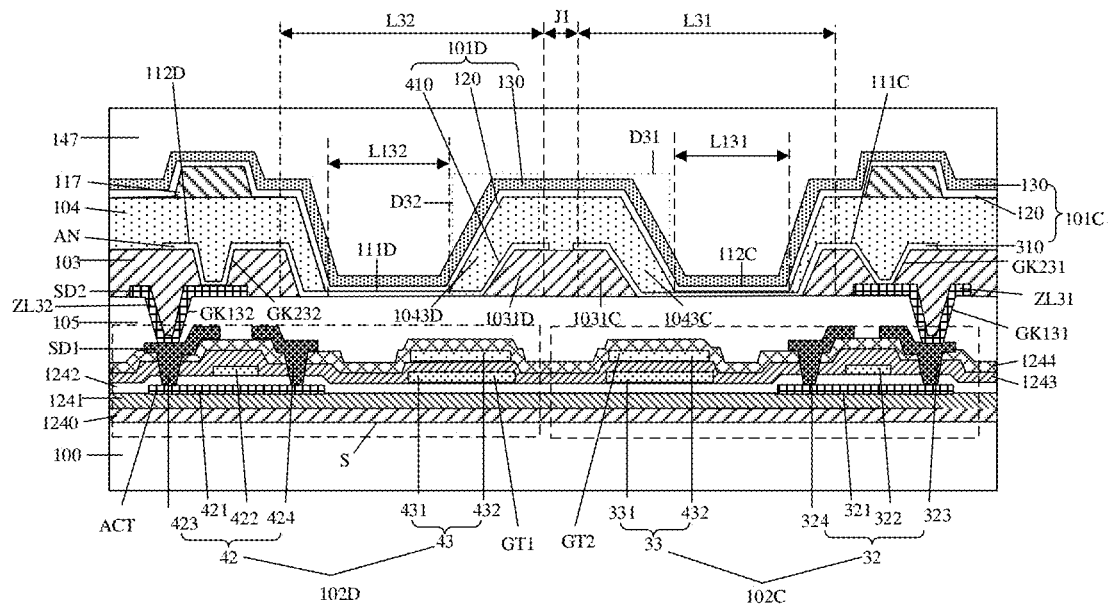
FIG. 7 is a cross-sectional view taken along a line A5-A6 in FIG. 3.

FIG. 4A is a planar layout schematic view of a partial structure of a sub-pixel provided by at least one example of the present disclosure. FIG. 4B is a planar layout schematic view of a partial structure of another sub-pixel provided by at least one example of the present disclosure. FIG. 4C is a planar layout schematic view of a partial structure of still another sub-pixel provided by at least one example of the present disclosure. FIG. 5 is a cross-sectional view taken along a line A1-A2 in FIG. 3; in FIG. 3, the line A1-A2 extends along a row direction Y and passes through the light emitting region corresponding to the first sub-pixel. FIG. 6 is a cross-sectional view taken along a line A3-A4 in FIG. 3; the line A3-A4 in FIG. 3 extends along a column direction X and passes through the light emitting region corresponding to the second sub-pixel. FIG. 7 is a cross-sectional view taken along a line A5-A6 in FIG. 3; in FIG. 3, the line A5-A6 extends along the column direction X and passes through the light emitting region corresponding to the third sub-pixel.

It should be noted that, in the embodiments of the present disclosure, the column direction X is, for example, the row direction, and the row direction Y is, for example, the column direction. For example, an included angle between the column direction X and the row direction Y involved in the present disclosure ranges from 70° to 90° and includes the points 70° and 90°. For example, the included angle between the column direction X and the row direction Y is 70°, 90°, or 80°, etc., which is set according to actual circumstances and is not limited in the embodiments of the present disclosure. For example, the included angle between the column direction X and the row direction Y is 75°, 85°, and the like.

For example, as shown in FIG. 5, the light emitting element 101A of the first sub-pixel P11 includes a first electrode 110, a second electrode 130, and a light emitting layer 120. For example, as shown in FIG. 6, the light emitting element 101B of the second sub-pixel P12 includes a first electrode 210 (for example an anode), a second electrode 130 (for example a cathode), and a light emitting layer 120. The first electrode 110 is provided on the base substrate 100, the second electrode 130 is provided on a side of the first electrode 110 facing away from the base substrate 100, and the light emitting layer 120 is provided between the first electrode 110 and the second electrode.

For example, as shown in FIG. 7, the light emitting element 101C of the third sub-pixel P131 includes the first electrode 310, the second electrode 130, and the light emitting layer 120. For example, as shown in FIG. 7, the light emitting element 101D of the third sub-pixel P132 includes the first electrode 410, the second electrode 130 and the light emitting layer 120. The first electrode 110, the first electrode 210, the first electrode 310 and the first electrode 410 are provided in the first electrode layer AN. The light emitting layer 120 is provided between the first electrode layer AN and the second electrode 130, and the first electrode layer AN is provided on a side of the light emitting layer 120 close to the base substrate 100.

It should be noted that, in the embodiments of the present disclosure, each of the second electrode 130 and the light emitting layer 120 for example is provided on entire surface of the base substrate 100.

For example, the material of the first electrode layer AN includes at least one transparent conductive oxide including indium tin oxide (ITO), indium zinc oxide (IZO), zinc oxide (ZnO), and the like. In addition, the first electrode layer AN for example includes a reflective layer made from a metal material having high reflectivity, such as silver (Ag). For example, the first electrode layer AN includes a multi-layer structure; for example, the multi-layer structure is a three-layer lamination of indium tin oxide, silver and indium tin oxide (ITO/Ag/ITO).

For example, for an OLED (Organic Light-Emitting Diode) display, the light emitting layer 120 includes a small molecular organic material or a polymer molecular organic material; for example, the material is a fluorescent light-emitting material or a phosphorescent light-emitting material; for another example, the material emits red light, green light, blue light, or white light. Moreover, according to requirements, the light emitting layer further includes a functional layer, such as an electron injection layer, an electron transport layer, a hole injection layer, a hole transport layer and the like.

For example, for an QLED (Quantum-dot Light-Emitting Diode) display, the light emitting layer 120 includes a quantum dot material, for example, a silicon quantum dot, a germanium quantum dot, a cadmium sulfide quantum dot, a cadmium selenide quantum dot, a cadmium telluride quantum dot, a zinc selenide quantum dot, a lead sulfide quantum dot, a lead selenide quantum dot, an indium phosphide quantum dot, an indium arsenide quantum dot, and the like. The particle size of the quantum dot for example is 2-20 nm.

For example, the second electrode 130 includes various conductive materials. For example, the second electrode 130 includes a metal material, such as lithium (Li), aluminum (Al), magnesium (Mg), silver (Ag), and the like.

For example, as shown in FIG. 3 and FIG. 5, the first insulation layer 104 is provided between the first electrode 110 and the light emitting layer 120. The first insulation layer includes a plurality of first openings. In the first sub-pixel P11, the first insulation layer 104 has a first opening 1041A in the light emitting region L1. The first opening 1041A is disposed corresponding to the first sub-pixel P11, the first opening 1041A is configured to expose the first electrode 110 to form an effective light emitting region L11 of the light emitting element of the first sub-pixel P11, and the effective light emitting region L11 at least partially surrounds at least one island region. For example, as shown in FIG. 4A, the effective light emitting region L11 surrounds the island region D1.

Figure 8A:
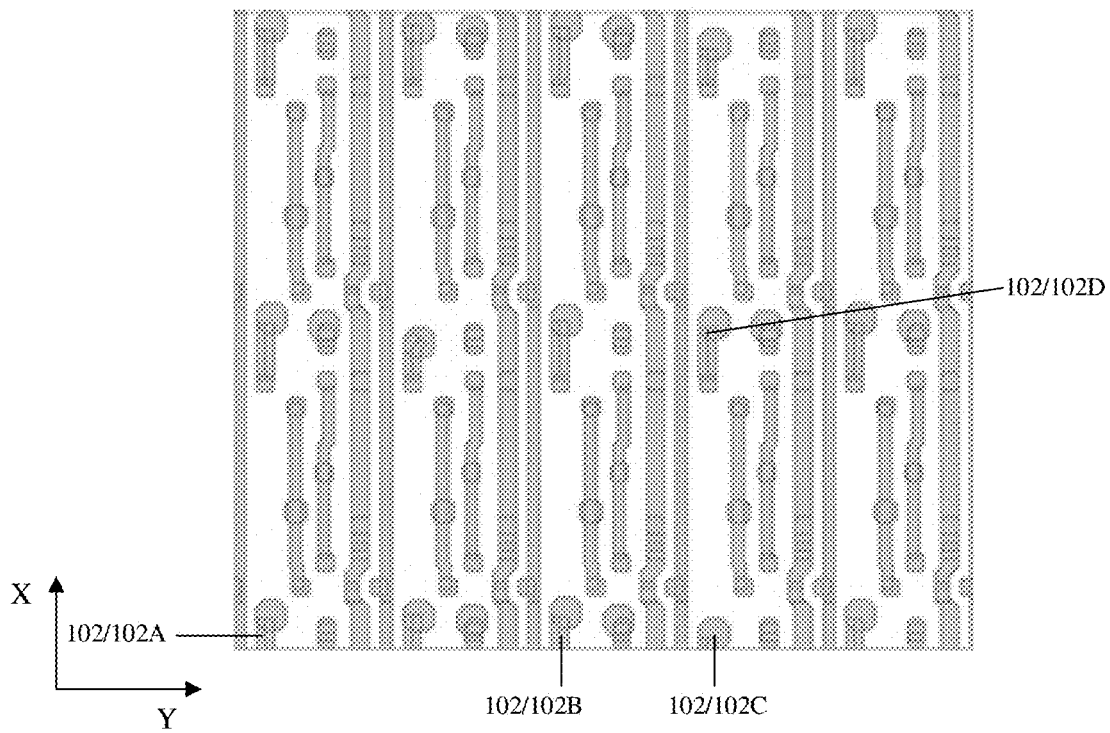
FIG. 8A is a plan view of a first conductive layer provided by at least one embodiment of the present disclosure.
Figure 8B:
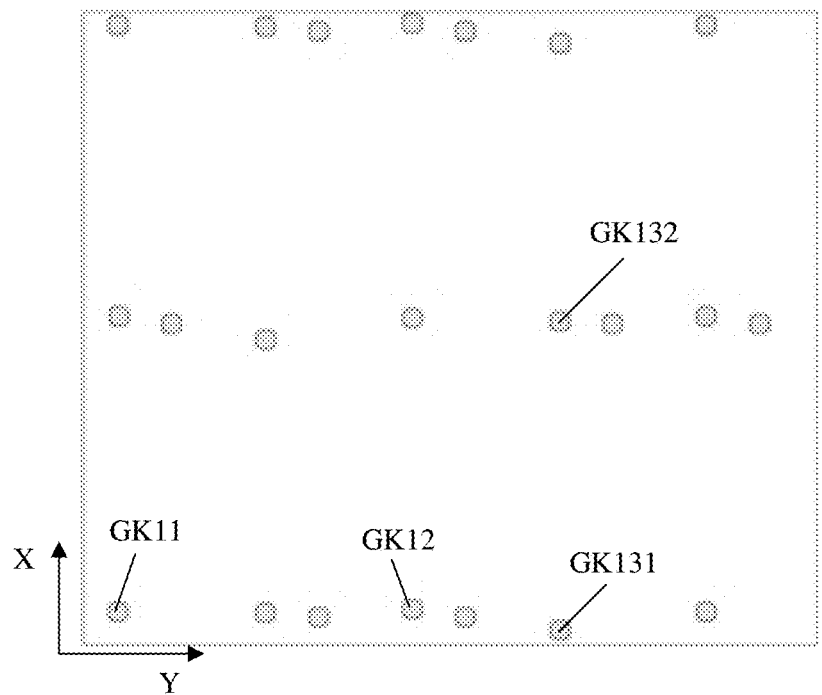
FIG. 8B is a plan view of a third insulation layer provided by at least one embodiment of the present disclosure.
Figure 8C:
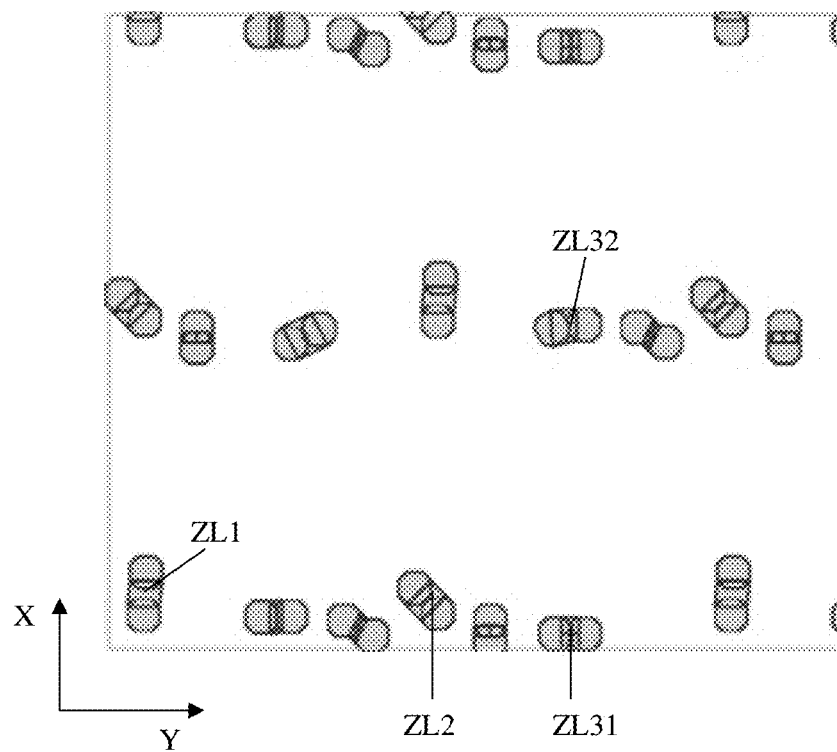
FIG. 8C is a plan view of a second conductive layer provided by at least one embodiment of the present disclosure.
Figure 8D:
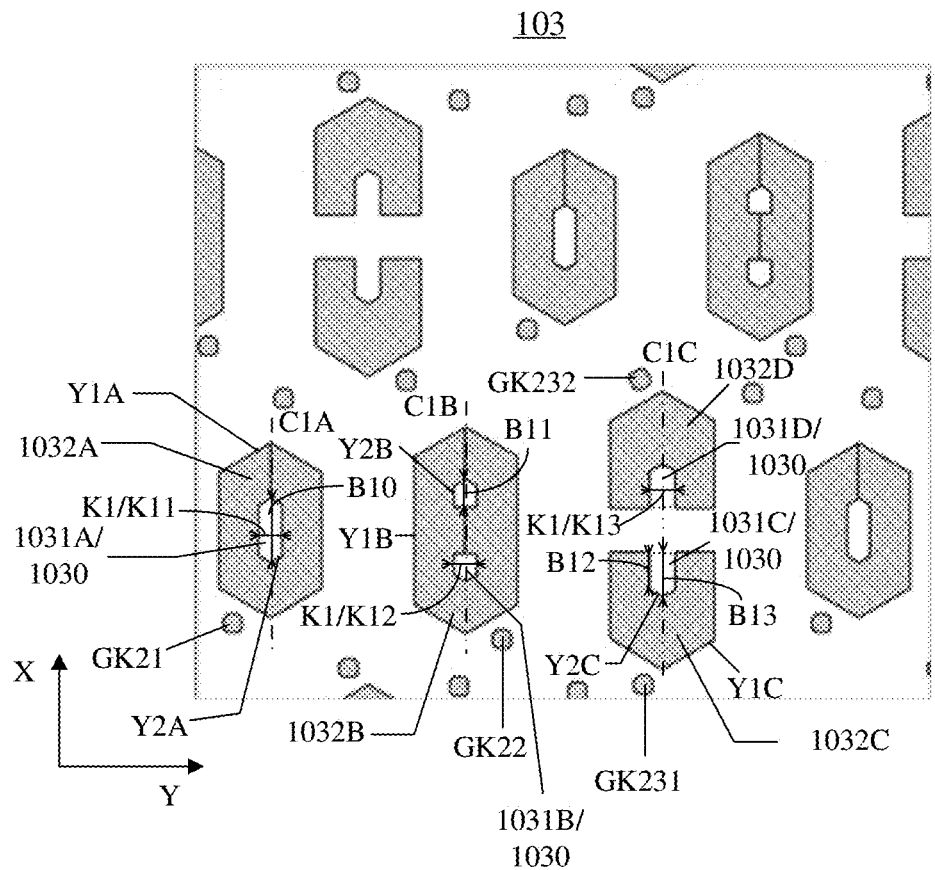
FIG. 8D is a plan view of a second insulation layer provided by at least one embodiment of the present disclosure.
Figure 8E:
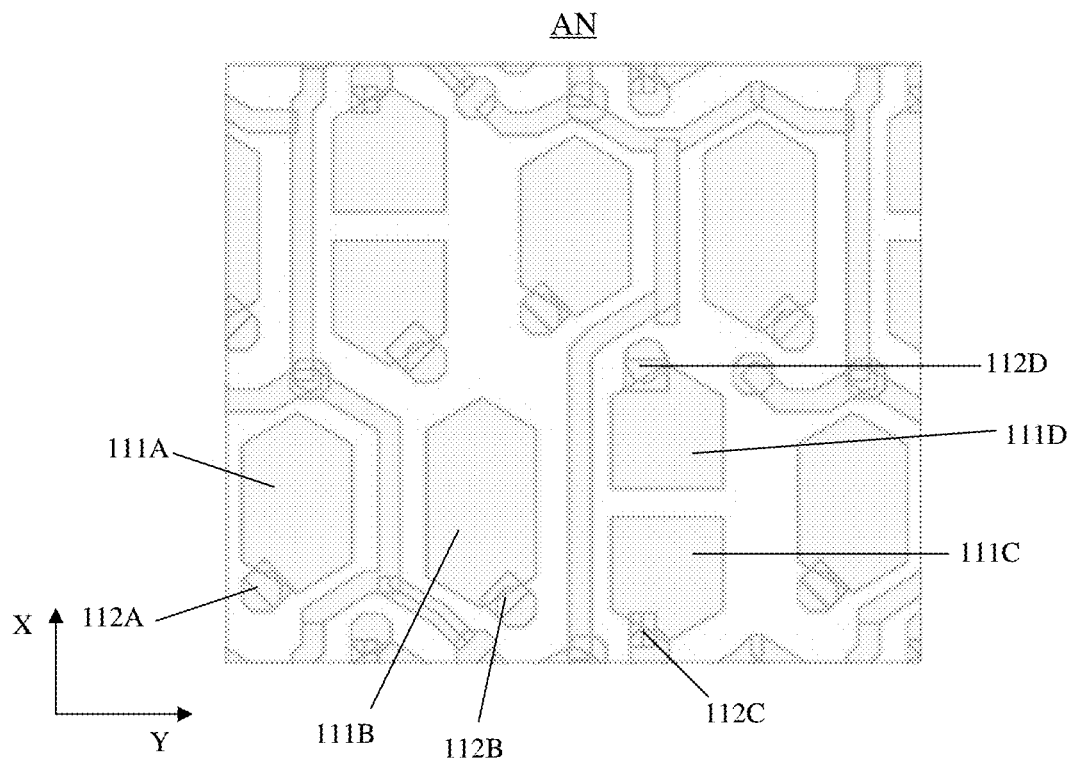
FIG. 8E is a plan view of a first electrode layer provided by at least one embodiment of the present disclosure.
Figure 8F:
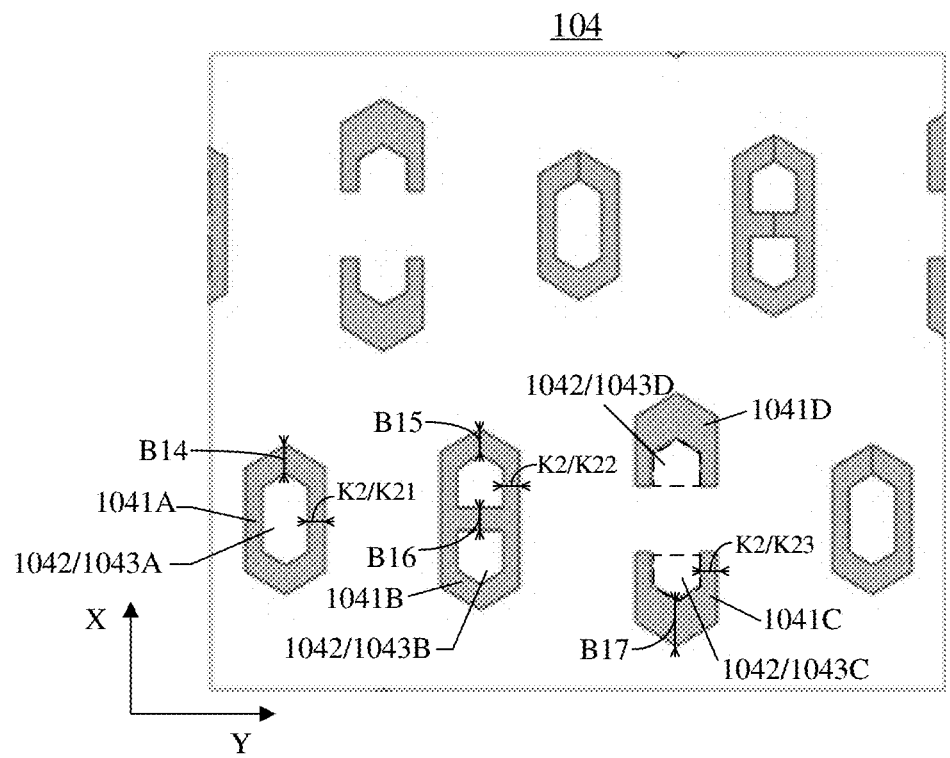
FIG. 8F is a plan view of a first insulation layer provided by at least one embodiment of the present disclosure.

FIG. 8F is a plan view of a first insulation layer provided by at least one embodiment of the present disclosure. FIG. 8D is a plan view of a second insulation layer provided by at least one embodiment of the present disclosure.

For example, in some embodiments, as shown in FIG. 4A, FIG. 5, FIG. 8F and FIG. 8D, the first insulation layer 104 includes a first insulation pattern 1042, a second insulation pattern 1030 is disposed on a side of the first electrode 110 close to the base substrate 100; in each island region (for example, the island region D1 shown in FIG. 4A, the island region D22 and the island region D21 shown in FIG. 4B, as well as the island region D31 and the island region D32 shown in FIG. 4C), the second insulation pattern 1030, the first electrode 110, the first insulation pattern 1042, the light emitting layer 120 and the second electrode 130 are sequentially provided in the island region along a direction facing away from the base substrate 100. Taking the island region D1 as an example, the distance G1 between a portion of the first electrode 110 in the island region D1 and the main surface S of the base substrate 100 in the direction perpendicular to the main surface S of the base substrate 100, is greater than the distance G2 between a portion of the first electrode 110 in the effective light emitting region L11 and the main surface S of the base substrate 100 in the direction perpendicular to the main surface S of the base substrate 100. That is, the portion of the first electrode 110 in the island region D1 is higher than the portion of the first electrode 110 in the effective light emitting region L11, so that side surfaces of the first electrode 110 are able to participate in light emission adjustment of the effective light emitting region L11, so as to achieve better color gamut and white-light color shift.

For example, the material of the first insulation layer 104 includes an inorganic insulation material such as silicon oxide, silicon nitride, silicon oxynitride and the like, or includes an organic insulation material such as polyimide, polyphthalimide, polyamide, acrylic resin, benzocyclobutene, phenolic resin and the like, which are not limited in the embodiments of the present disclosure. For example, in some embodiments, the first insulation layer 104 and the first insulation pattern 1042 are provided in the same layer using the same material, so as to save the procedure of the manufacturing process.

For example, in some embodiments, as shown in FIG. 4A and FIG. 5, the display substrate 1 further includes a second insulation layer 103 (for example a second planarization layer). The second insulation layer 103 is provided on the base substrate 100, and the light emitting element is provided on a side of the second insulation layer 103 facing away from the base substrate 100. The second insulation layer 103 surrounds an edge of the light emitting region L0 and is in at least one light emitting region L0. For example, the second insulation pattern 1030 has at least one protrusion, a second opening is formed between an edge of the second insulation layer 103 surrounding the light emitting region L0 and an edge of the at least one protrusion, and the first electrode is provided on the side of the second insulation layer facing away from the base substrate and covers the second opening.

For example, in some embodiments, the second insulation layer 103 and the second insulation pattern 1030 are provided in the same layer using the same material, so as to save the procedure of the manufacturing process. For example, as shown in FIG. 4A and FIG. 5, in the light emitting region L1 corresponding to the first sub-pixel P11, the second insulation layer 103 has a first protrusion 1031A in the light emitting region L1, the second opening 1032A is formed between the edge of the second insulation layer 103 surrounding the light emitting region L1 and the edge of the first protrusion 1031A, and the first electrode 110 is provided on the side of the second insulation layer 103 facing away from the base substrate 100 and covers the second opening 1032A.

For example, as shown in FIG. 4B and FIG. 6, in the light emitting region L2 corresponding to the second sub-pixel P12, the second insulation layer 103 has a second protrusion 1031B in the light emitting region L2, for example, the total number of the second protrusion 1031B is two. The second opening 1032B is formed between the edge of the second insulation layer 103 surrounding the light emitting region L2 and the edges of the second protrusions 1031B. The first electrode 210 is provided on the side of the second insulation layer 103 facing away from the base substrate 100 and covers the second openings 1032B.

For example, as shown in FIG. 4C and FIG. 7, one third protrusion is provided in both the light emitting region L31 of the third sub-pixel P131 and the light emitting region L32 of the third sub-pixel P132, that is, the third protrusion 1031C and the third protrusion 1031D are provided in the light emitting region L31 and the light emitting region L32, respectively. In the light emitting region L31, the second opening 1032C is formed between the edge of the second insulation layer 103 surrounding the light emitting region L31 and the edge of the third protrusion 1031C, and the first electrode 310 covers the second opening 1032C. In the light emitting region L32, the second opening 1032D is formed between the edge of the second insulation layer 103 surrounding the light emitting region L32 and the edge of the third protrusion 1031D, and the first electrode 410 covers the second opening 1032D.

It should be noted that, in the embodiments of the present disclosure, the total number of the protrusion in each light emitting region is selected according to process requirements, and thus the light emitting region may be provided with one protrusion, two protrusions, and the like. For example, a certain light emitting region doesn't have any protrusion. The embodiments of the present disclosure are not limited thereto.

For example, the material of the second insulation layer 103 includes an inorganic insulation material such as silicon oxide, silicon nitride, silicon oxynitride and the like, or includes an organic insulation material such as polyimide, polyphthalimide, polyamide, acrylic resin, benzocyclobutene, phenolic resin and the like, which are not limited in the embodiments of the present disclosure.

For example, in some embodiments, as shown in FIG. 5, the display substrate 1 further includes the first insulation layer 104 (for example a pixel defining layer). The first insulation layer 104 is provided on the side of the second insulation layer 103 facing away from the base substrate 100 and has the first opening in each light emitting region; the first opening at least partially surrounds the at least one protrusion and is configured to at least expose a portion of the first electrode in the second opening to form the effective light emitting region of the light emitting element; the light emitting layer is provided at least on a side of the exposed portion of the first electrode facing away from the base substrate 100, and the second electrode 130 is provided on a side of the light emitting layer 120 facing away from the base substrate 100.

For example, in some embodiments, as shown in FIG. 8F and FIG. 8D, an orthographic projection of the first insulation pattern 1042 on the main surface S of the base substrate 100 at least partially overlaps an orthographic projection of the second insulation pattern 1030 on the main surface S of the base substrate 100. For example, the orthographic projection of the first insulation pattern 1042 on the main surface S of the base substrate 100 at least partially overlaps an orthographic projection of the at least one protrusion on the main surface S of the base substrate 100. It should be noted that in FIG. 8F, the first insulation layer 104 is shown reversely, that is, the portion filled with textures in the figure represents the portion where the first insulation layer 104 is removed. The first insulation pattern 1042 of the first insulation layer 104 at least partially covers at least one protrusion of the second insulation layer 103. A portion of the first insulation layer 104 (for example the first insulation pattern) is left in the light emitting region of each sub-pixel, and the first insulation layer 104 is further provided outside the light emitting region. Thus, in the light emitting region, the light emitting layer in the region where the first insulation pattern 1042 is provided is not in contact with the first electrode, so that the light is not directly emitted here. By providing the first insulation pattern 1042 and the second insulation pattern 1030 (for example at least one protrusion), the light emission of the plurality of sub-pixels is adjusted to achieve better color gamut and white-light color shift.

For example, as shown in FIG. 5, the first opening 1041A surrounds the first protrusion 1031A and is configured to expose a portion of the first electrode 110 in the second opening 1032A to form the effective light emitting region L11 of the light emitting element 101A. A portion of the light emitting layer 120 is provided on the side of the exposed portion of the first electrode 110 facing away from the base substrate 100, and the second electrode 130 is provided on the side of the light emitting layer 120 facing away from the base substrate 100. As shown in FIG. 3, the effective light emitting region L11 surrounds the first protrusion 1031A.

For example, as shown in FIG. 3 and FIG. 6, in the second sub-pixel P12, the first insulation layer 104 has a first opening 1041B in the light emitting region L2. The first opening 1041B surrounds the two second protrusions 1031B and is configured to expose a portion of the first electrode 210 in the second opening 1032B to form the effective light emitting region L12 of the light emitting element 101B. A portion of the light emitting layer 120 is provided on the side of the exposed portion of the first electrode 210 facing away from the base substrate 100, and the second electrode 130 is provided on the side of the light emitting layer 120 facing away from the base substrate 100. As shown in FIG. 3, two polygonal second protrusions 1031B are provided in the light emitting region L2.

For example, as shown in FIG. 3 and FIG. 7, in the third sub-pixel P131 (taking one of the third sub-pixels as an example), the first insulation layer 104 has a first opening 1041C in the light emitting region L31. The first opening 1041C surrounds the edge of the third protrusion 1031C in the light emitting region L31 and is configured to expose a portion of the first electrode 310 in the second opening 1032C to form the effective light emitting region L131 of the light emitting element 101C. A portion of the light emitting layer 120 is provided on the side of the exposed portion of the first electrode 310 facing away from the base substrate 100, and the second electrode 130 is provided on the side of the light emitting layer 120 facing away from the base substrate 100. As shown in FIG. 3, the effective light emitting region L131 surrounds the edge of the third protrusion 1031C in the light emitting region L31 and has an arch shape.

For example, as shown in FIG. 5, a portion of the second insulation layer 103 in the region where the bottom of the second opening is provided (the effective light emission L11) has a thickness of zero along the direction perpendicular to the main surface S of the base substrate 100. That is, the second opening exposes the layer under the second insulation layer 103. Alternatively, the thickness of the portion of the second insulation layer 103 in the region where the bottom of the second opening is provided (the effective light emitting region L11) along the direction perpendicular to the main surface S of the base substrate 100 is greater than zero and smaller than the thickness H1 of the second insulation pattern 1030 along the direction perpendicular to the main surface S of the base substrate 100. That is, the second insulation pattern 1030 protrudes from the portion of the second insulation layer 103 in the effective light emitting region L11 in the direction perpendicular to the base substrate 100. Thus, the first electrode 110 provided on the second insulation layer 103 can adjust the light emission of the plurality of sub-pixels to achieve better color gamut and white-light color shift.

FIG. 8B is a plan view of a third insulation layer provided by at least one embodiment of the present disclosure. FIG. 8E is a plan view of a first electrode layer provided by at least one embodiment of the present disclosure.

For example, in some embodiments, as shown in FIG. 5 and FIG. 8B, the display substrate 1 further includes a third insulation layer 105, and the third insulation layer 105 is provided on the side of the second insulation layer 103 close to the base substrate 100. For example, in some embodiments, as shown in FIG. 5, the third insulation layer has a third insulation pattern (not shown) provided in the island region D1, and a distance between the third insulation pattern and the main surface S of the base substrate 100 along the direction perpendicular to the main surface S of the base substrate 100 is greater than a distance between a portion of the third insulation layer 105 provided in the effective light emitting region L11 and the main surface S of the base substrate 100 along the direction perpendicular to the main surface S of the base substrate 100. That is, the third insulation pattern protrudes from the portion of the third insulation layer 105 in the effective light emitting region L11 in the direction perpendicular to the base substrate 100. Thus, the first electrode 110 provided above the third insulation layer 105 can adjust the light emission of the plurality of sub-pixels to achieve better color gamut and white-light color shift.

For example, in some embodiments, as shown in FIG. 5, the thickness of the portion of the third insulation layer 105 provided in the effective light emitting region L11 in the direction perpendicular to the main surface S of the base substrate 100 is smaller than that of the portion, surrounding the effective light emitting region L11, of the third insulation layer 105 in the direction perpendicular to the main surface S of the base substrate 100. That is, the third insulation layer 105 protrudes from the portion of the third insulation layer 105 in the effective light emitting region L11 in the direction perpendicular to the base substrate 100. Thus, the first electrode 110 provided above the third insulation layer 105 can adjust the light emission of the plurality of sub-pixels to achieve better color gamut and white-light color shift.

It should be noted that the surface of the third insulation layer 105 facing away from the base substrate 100 shown in the figure is a planar surface, but the surface of the third insulation layer 105 facing away from the base substrate 100 for example is a surface having a protrusion provided in the island region, the present disclosure is not limited thereto.

FIG. 8D is a plan view of a second insulation layer provided by at least one embodiment of the present disclosure. It should be noted that in FIG. 8D, the second insulation layer 103 is shown reversely, that is, the portion filled with textures in the figure is the portion where the second insulation layer 103 is removed.

For example, in some embodiments, as shown in FIG. 8D, the first protrusion 1031A of the first sub-pixel P11 is shown as an unfilled hexagon shape. The second protrusion 1031B of the second sub-pixel P12 is shown as an unfilled pentagon shape. The third protrusion 1031C of the third sub-pixel P131 is shown as an unfilled pentagon shape. The third protrusion 1031D of the third sub-pixel P132 is shown as an unfilled pentagon shape. A portion of the second insulation layer 103 (for example at least one protrusion) is left in the light emitting region of each sub-pixel, and the second insulation layer 103 is further provided outside the light emitting region.

It should be noted that the embodiments of the present disclosure do not limit the planar shapes of the first protrusion 1031A, the second protrusion 1031B, the third protrusion 1031C, and the third protrusion 1031D.

For example, in some embodiments, at least one protrusion has a side surface provided at the edge thereof, the second insulation pattern has a side surface provided at the edge thereof, and the tangent of the side surface intersects with the plane where the main surface of the base substrate is provided, and the intersection angle is the first angle $\alpha1$; the first electrode has a first sub-portion covering the second insulation pattern, the tangent of the side surface, at the edge of the first sub-portion, of the first sub-portion intersects the plane where the main surface of the base substrate is provided, and the intersection angle is the second angle $\alpha2$, the second angle $\alpha2$ and the first angle $\alpha1$ are substantially same, and the value range of the first angle $\alpha1$ is from 15 degrees to 70 degrees.

The first angle $\alpha1$ and the second angle $\alpha2$ are described below by taking the structure of the first sub-pixel P11 as an example.

For example, as shown in FIG. 5, the first protrusion 1031A of the second insulation pattern 1030 has the side surface S1 at the edge thereof. The tangent of the side surface S1 intersects with the plane where the main surface S of the base substrate 100 is provided, and the intersecting angle is the first angle $\alpha1$. That is, the side surface S1 is inclined relative to the base substrate 100, and the intersection angle is an angle between the side surface S1 and the main surface S of the base substrate 100 (for example the angle is an acute angle). By providing the inclined side surface S1 of the first protrusion 1031A, it is possible to form the island region in the light emitting region, and thus the island region directs out the part of the light, which is emitted by the effective light emitting region and enters the first insulation layer 104, so as to increase the light efficiency.

For example, in other embodiments, the first protrusion has the inclined side surface at part of edge thereof, which is not limited to the embodiments of the present disclosure.

For example, in some embodiments, as shown in FIG. 5, the first electrode 110 has a main body portion 111A provided in the light emitting region L1. The main body portion 111A has a first sub-portion 1111 covering the side surface S1 of the first protrusion 1031A. The first sub-portion 1111 on the side surface S1 has a uniform thickness. The first sub-portion 1111 intersects with a direction parallel to the main surface S1 of the base substrate 100, and the intersecting angle is the second angle $\alpha2$. That is, the first sub-portion 1111 is also inclined relative to the base substrate 100, and the intersection angle is the included angle between the side surface S1 and the main surface S of the base substrate 100 (for example the included angle is an acute angle). The second angle α2 and the first angle α1 are substantially same. The first sub-portion 1111 is a constituent part of the island region in the light emitting region. The effective light emitting region L11 emits light, and at least part of the light entering the first insulation layer 104 is to be directed out. Due to that the first sub-portion 1111 is inclined, the at least part of the light is reflected and the propagation path is changed, so that the light is output to a light output surface of the display substrate; in this way, the light output efficiency of the first sub-pixel is increased, and at the same time, it is beneficial to achieve better the color gamut, and the white-light color shift of the display substrate.

For example, in some embodiments, the value range of the first angle α1 is approximately, for example, from 15 degrees to 70 degrees. For example, the value of the first angle α1 is approximately 55 degrees, so that the display substrate achieves a good balance in performances such as the light output efficiency, the color gamut, and the white-light color shift, in order to meet product requirements. It should be noted that, the value range or the value of the second angle α2 for example refers to the first angle α1.

It should be noted that, in the embodiments of the present disclosure, "approximately" represents that the value fluctuates for example within a range of ±15% or ±5%.

It should be noted that, in other sub-pixels, for example, the side surfaces of the second protrusion 1031B in FIG. 6, the third protrusion 1031C and the third protrusion 1031D in FIG. 7 have structure similar to that of the side surface S1 of the protrusion 1031A shown in FIG. 5 and will not be described in detail. The main body portion 111B of the first electrode 210 in FIG. 6, the main body portion 111C of the first electrode 310 in FIG. 7, and the main body 111D of the first electrode 410 each also has a first sub-portion, and the first sub-portions covers the side surfaces of the second protrusion 1031B, the third protrusion 1031C and the third protrusion 1031D respectively, the structure of each of the first sub-portions is similar to the structure of the first sub-portion 1111 provided in FIG. 5 and will not be repeated here.

For example, in some embodiments, as shown in FIG. 8F and FIG. 8D, the first insulation pattern 1042 includes at least one insulation pattern sub-portion (for example, the first insulation pattern sub-portion 1043A, the second insulation pattern sub-portion 1043B, the third insulation pattern sub-portion 1043C, and the fourth insulation pattern sub-portion 1043D) provided in each light emitting region. The at least one insulation pattern sub-portion each covers at least part of at least one protrusion (for example, the first protrusion 1031A, the second protrusion 1031B, the third protrusion 1031C, the third protrusion 1031D), and the orthographic projection of the at least one protrusion on the main surface S of the base substrate 100 at least partially overlaps the orthographic projection of the at least one insulation pattern sub-portion on the main surface S of the base substrate 100. For example, the insulation pattern sub-portion in the light emitting region of each sub-pixel at least partially cover the corresponding protrusion. In the direction perpendicular to the main surface S of the base substrate 100, the first sub-portion of the main body portion of the first electrode is provided between the at least one insulation pattern sub-portion and the at least one protrusion.

For example, in some embodiments, the orthographic projection of the at least one protrusion on the main surface of the base substrate is within the orthographic projection of the at least one insulation pattern sub-portion on the main surface of the base substrate. The distance between an edge of the orthographic projection of the at least one insulation pattern sub-portion on the main surface of the base substrate and an edge of the orthographic projection of the at least one protrusion on the main surface of the base substrate is substantially same along the circumferential direction of the orthographic projection of the at least one protrusion on the main surface of the base substrate.

For example, as shown in FIG. 5, in the first sub-pixel P11, the first insulation pattern 1042 includes a first insulation pattern sub-portion 1043A provided in the light emitting region L1. For example, the first insulation pattern sub-portion 1043A covers the entirety of the first protrusion 1031A. The orthographic projection of the first protrusion 1031A on the main surface S of the base substrate 100 is within the orthographic projection of the first insulation pattern sub-portion 1043A on the main surface S of the base substrate 100. For example, the orthographic projection of the first protrusion 1031A on the main surface S of the base substrate 100 overlaps the orthographic projection of the first insulation pattern sub-portion 1043A on the main surface S of the base substrate 100, that is, the orthographic projection of the first protrusion 1031A is within the orthographic projection of the first insulation pattern sub-portion 1043A. In the direction perpendicular to the main surface S of the base substrate 100, the first sub-portion 1111 of the main body portion 111A of the first electrode 110 is provided between the first insulation pattern sub-portion 1043A and the first protrusion 1031A. For example, the side surface of the first insulation pattern sub-portion 1043A is parallel to the first sub-portion 1111, and the side surface of the first insulation pattern sub-portion 1043A has a certain angle with respect to the main surface S of the base substrate 100. For example, the effective light emitting region L11 of the first sub-pixel P11 surrounds the first insulation pattern sub-portion 1043A along the circumferential direction of the first insulation pattern sub-portion 1043A. For example, the profile shape of the orthographic projection of the first protrusion 1043A on the base substrate 100 is substantially same as the profile shape of orthographic projection of the edge, facing away from the first protrusion 1043A, of the effective light emitting region L11 of the first sub-pixel P11 on the surface S of the base substrate 100, and the profile shape is for example the hexagon.

Referring to FIG. 4A and FIG. 8F, the maximum size B14 of the effective light emitting region L11 of the first sub-pixel P11 in the column direction is greater than the maximum size K21 thereof in the row direction, the maximum size of the first protrusion 1031A of the first sub-pixel P11 in the column direction is greater than the maximum size thereof in the row direction, and the distance between the edge of the orthographic projection of the first protrusion 1031A on the base substrate 100 in the column direction and the edge of the corresponding effective light emitting region L11 in the column direction is substantially same. For example, the distances between respective points of the edge of the first insulation pattern sub-portion 1043A and respective corresponding points of the edge of the first protrusion 1031A are substantially same along the circumferential direction of the first protrusion 1031A. That is, the first insulation pattern sub-portion 1043A uniformly covers the edge of the first protrusion 1031A. Thus, in each light emitting region, the light, which is emitted in the effective light emitting region and enters the first insulation pattern sub-portion 1043A, is reflected by the first sub-portion 1111 of the main body portion 111A and then output from the first insulation pattern sub-portion 1043A; in this way, the light output efficiency of the first sub-pixel is increased, and at the same time, it is beneficial to achieve better the color gamut, and the white-light color shift of the display substrate.

For example, as shown in FIG. 5, the first insulation pattern sub-portion 1043A, the first protrusion 1031A, the portion of the main body portion 111A covering the first protrusion 1031A, as well as the light emitting layer 120 and the second electrode 130 that cover the first insulation pattern sub-portion 1043A together form the island region D1 in the light emitting region L1. The side portion of the island region D1 emits light, while the portion parallel to the main surface S of the base substrate 100 does not emit light. For example, for better color shift, the sensitivity of the light emitted by the first sub-pixel needs to be reduced; in the case that the first sub-pixel is a red sub-pixel, the island region D1 is provided in the light emitting region L1 of the first sub-pixel, in order to reduce the sensitivity of red light. For example, the larger the perimeter of the island region D1, the better the effect of reducing the sensitivity of red light. The size and the number of the island region D1 is designed according to product requirements.

For example, in other examples, the total number of island regions D1 in the first sub-pixel is two, three, etc., which is not limited in the embodiments of the present disclosure.

For example, in some embodiments, the distance between the edge of the orthographic projection of the at least one protrusion on the main surface of the base substrate in the row direction and the edge of the corresponding effective light emitting region in the row direction is substantially same.

For example, as shown in FIG. 6, in the second sub-pixel P12, the first insulation pattern 1042 includes a plurality of second insulation pattern sub-portions 1043B provided in the light emitting region L2. For example, the plurality of second insulation pattern sub-portions 1043B respectively cover the entirety of the two second protrusions 1031B. For example, the orthographic projection of the second protrusion 1031B on the main surface S of the base substrate 100 overlaps the orthographic projection of the corresponding second insulation pattern sub-portion 1043B on the main surface S of the base substrate 100, that is, the orthographic projection of the second protrusion 1031B is within the orthographic projection of the second insulation pattern sub-portion 1043B. In the direction perpendicular to the main surface S of the base substrate 100, the first sub-portion of the main body portion 111B of the first electrode 210 is provided between the second insulation pattern sub-portion 1043B and the second protrusion 1031B.

For example, in some embodiments, as shown in FIG. 6 and FIG. 8F, the maximum size B15 of the effective light emitting region L12 of the second sub-pixel P12 along the column direction is greater than the maximum size K12 thereof along the row direction, and the two second protrusions 1031B are arranged at intervals in the column direction. For example, the side surface of the second insulation pattern sub-portion 1043B is an inclined surface and has a certain angle with respect to the main surface S of the base substrate 100. For example, the side surface of the second insulation pattern sub-portion 1043B is parallel to or not parallel to the side surface of the second protrusion 1031B, which are not limited to the embodiments of the present disclosure. Referring to FIG. 4B, the distances between respective points of the edge of the second insulation pattern sub-portion 1043B and corresponding respective points of the edge of the second protrusion 1031B are substantially same along the circumferential direction of the second protrusion 1031B. That is, the second insulation pattern sub-portions 1043B uniformly cover the edge of the second protrusion 1031B. Thus, in each light emitting region, the light, which is emitted in the effective light emitting region and enters the second insulation pattern sub-portion 1043B, is reflected by the main body portion 111B and then output from the first insulation pattern sub-portion 1043B; in this way, the light output efficiency of the second sub-pixel is increased, and at the same time, it is beneficial to achieve better the color gamut, and the white-light color shift of the display substrate.

For example, in some embodiments, the first insulation pattern further includes a plurality of second insulation pattern sub-portions covering the plurality of second protrusions respectively, and the effective light emitting region of the second sub-pixel surround each of the second insulation pattern sub-portions along the circumference direction of the second insulation pattern sub-portions; the effective light emitting region includes a portion provided between the plurality of second protrusions.

For example, as shown in FIG. 6, the second insulation pattern sub-portion 1043B, the second protrusion 1031B, the portion of the main body portion 111B covering the second protrusion 1031B, as well as the light emitting layer 120 and the second electrode 130 that cover the second insulation pattern sub-portion 1043B together form the island regions D21 and D22 provided in the light emitting region L2, that is, two island regions D21 and D22 at intervals are provided in the light emitting region L2. The side portions of the island region D21 and the island region D22 output light, while the portions parallel to the main surface S of the base substrate 100 does not output light. For example, for better color shift, the sensitivity of the light emitted by the second sub-pixel needs to be reduced; in the case that the second sub-pixel is a blue sub-pixel, the perimeters of the island regions D21 and D22 in the light emitting region L2 of the second sub-pixel are both increased, in order to reduce the sensitivity of blue light.

For example, in other examples, the number of island regions D21 and D22 in the second sub-pixel may be one, etc., which is not limited in the embodiments of the present disclosure. For example, as shown in FIG. 7, the third sub-pixel P131 is taken as an example; in the third sub-pixel P131, the first insulation pattern 1042 includes the third insulation pattern sub-portion 1043C provided in the light emitting region L31. For example, the third insulation pattern sub-portion 1043C further covers the entire edge of the third protrusion 1031C in the light emitting region L31. For example, the orthographic projection of the third protrusion 1031C on the main surface S of the base substrate 100 overlaps the orthographic projection of the third insulation pattern sub-portion 1043C on the main surface S of the base substrate 100. In the direction perpendicular to the main surface S of the base substrate 100, the main body portion 111C of the first electrode 310 is provided between the third insulation pattern sub-portion 1043C and the second protrusion 1031C. For example, the side surface of the third insulation pattern sub-portion 1043C is an inclined surface and has a certain angle with respect to the main surface S of the base substrate 100. For example, the side surface of the third insulation pattern sub-portion 1043C is parallel to or not parallel to the side surface of the protrusion of the second protrusion 1031C, which are not limited to the embodiments of the present disclosure. Referring to FIG.

4C, the distances between respective points of the edge of the third insulation pattern sub-portion 1043C and corresponding respective points of the edge of the third protrusion 1031C are substantially same along the circumferential direction of the third protrusion 1031C. That is, the third insulation pattern sub-portion 1043C uniformly covers the edge of the third protrusion 1031C. Thus, in each light emitting region, the light, which is emitted in the effective light emitting region and enters the second insulation pattern sub-portion 1043B, is reflected by the main body portion 111C and then output from the third insulation pattern sub-portion 1043C; in this way, the light output efficiency of the third sub-pixel is increased, and at the same time, it is beneficial to achieve better the color gamut, and the white-light color shift of the display substrate For example, as shown in FIG. 7, the third insulation pattern sub-portion 1043C, the third protrusion 1031C, the portion of the main body portion 111C covering the third protrusion 1031C, as well as the light emitting layer 120 and the second electrode 130 that cover the third insulation pattern sub-portion 1043C together form the island region D31 in the light emitting region L31, that is, the island region D31 is provided in the light emitting region L31. The side portion of the island region D31 outputs light, while the portion parallel to the main surface S of the base substrate 100 does not output light. For example, for better color shift, the sensitivity of the light emitted by the third sub-pixel needs to be reduced; in the case that the second sub-pixel is a green sub-pixel, the perimeter of the island region D31 in the light emitting region L31 of the third sub-pixel is increased, in order to reduce the sensitivity of green light.

For example, in some embodiments, as shown in FIG. 7 and FIG. 8D, the effective light emitting region L131 of the third sub-pixel P131 surrounds a portion of the edge of the third protrusion 1031C, and the effective light emitting region L132 of the third sub-pixel P132 surrounds a part of the edge of the third protrusions 1031D. For example, the effective light emitting region L131 of the third sub-pixel P131 has a notch (provided in the island region D31), so that the effective light emitting region L131 has an arch shape opening towards the effective light emitting region L132. The orthographic projection of the notch (provided in the island region D31) on the main surface S of the base substrate 100 at least partially overlaps the orthographic projection of the third protrusion 1031C on the main surface S of the base substrate 100. For example, the effective light emitting region L132 also has a notch (provided in the island region D32).

For example, in some embodiments, as shown in FIG. 7 and FIG. 8D, the notch of the effective light emitting region L131 of the third sub-pixel P131 and the notch of the effective light emitting region L132 of the third sub-pixel P132 are respectively provided at adjacent edges of the two third sub-pixels. The two notches are approximately symmetrical about a line extending in the row direction, so as to improve the uniformity of light emission.

For example, in other examples, the number of island regions D21 and D22 in the second sub-pixel are two, etc., which is not limited in the embodiments of the present disclosure. For example, as shown in FIG. 4C, the edge of each of the island region D31 and the island region D32 is a non-closed geometry, and the specific structure will be described in detail in the following.

It should be noted that in FIG. 7, the structures of the third sub-pixel P131 and the third sub-pixel P132 are the same. The third insulation pattern sub-portion 1043D, the third protrusion 1031D, the portion of the main body portion 111D covering the third protrusion 1031D, as well as the light emitting layer 120 and the second electrode 130 that cover the third insulation pattern sub-portion 1043D together form the island region D32 in the light emitting region L32, which will not be described in detail here.

For example, in some embodiments, in the direction perpendicular to the main surface of the base substrate, the maximum thickness of the at least one protrusion is H1, and the maximum thickness of the portion of the second insulation layer surrounding the light emitting region is H2, wherein H1<H2. For example, the first sub-pixel P11 shown in FIG. 5 is taken as an example. As shown in FIG. 5, the maximum thickness of the first protrusion 1031A is H1, and the maximum thickness of the portion of the second insulation layer 103 surrounding the light emitting region L1 (that is, the portion of the second insulation layer 103 outside the light emitting region L1) is H2. The maximum thickness H1 is smaller than the maximum thickness H2. Thus, the influence of the island region D1 of the light emitting region L1 on the luminous efficiency is reduced.

It should be noted that, in the embodiments of the present disclosure, the maximum thickness of the first protrusion 1031A refers to a vertical distance between a surface, farthest facing away from the main surface S of the base substrate 100, of the first protrusion 1031A and a surface, closest to the main surface S of the base substrate 100 of the first protrusion 1031A in the direction perpendicular to the main surface S of the base substrate 100. The maximum thickness of other structures is also marked in the above-mentioned manner, which will not be described in detail here.

For example, in some embodiments, the value range of the maximum thickness H1 of the at least one protrusion is from 0.5 microns to 3 microns. For example, as shown in FIG. 5, the value range of the maximum thickness H1 of the first protrusion 1031A is approximately, for example, from 0.5 microns to 3 microns. For example, the maximum thickness H1 of the first protrusion 1031A is approximately 1.5 microns. For example, the maximum thickness of the second protrusion 1031B, the third protrusion 1031C and the third protrusion 1031D may refer to the maximum thickness H1 of the first protrusion 1031A, which will not be described in detail here.

For example, in some embodiments, as shown in FIG. 8D, the plurality of sub-pixels of the pixel unit are arranged in the row direction, and in the row direction, the width K1 of at least one protrusion is greater than or equal to $H1/\tan(\alpha1)$. For example, as shown in FIG. 8D, the width K11 of the first protrusion 1031A is greater than or equal to $H1/\tan(\alpha1)$, so as to reduce the influence of the island region D1 of the light emitting region L1 on the luminous efficiency in the case of adjusting the color gamut and white-light color shift. For example, the value ranges of the width K12 and the width K13 of the second protrusion 1031B, the third protrusion 1031C and the third protrusion 1031D may refer to the width K11 of the first protrusion 1031A, which will not be described in detail here.

For example, as shown in FIG. 8D, the value range of the width K11 approximately from 4 microns to 6 microns, for example, the value is approximately 5 microns. For example, the value range of the width K12 is approximately from 4 microns to 6 microns, for example, the value is approximately 5 microns. For example, the value range of the width K13 is approximately from 4.5 microns to 6.5 microns, for example, the value is approximately 5.5 microns.

For example, in some embodiments, a center line of the at least one protrusion along the column direction coincides with a center line, along the column direction, of the light emitting region where the at least one protrusion is provided. For example, as shown in FIG. 4A and FIG. 8D, the center line C1A of the first protrusion 1031A along the column direction X in FIG. 8D coincides with the center line C2A (shown in FIG. 4A), along the column direction X, of the light emitting region L1 where the first protrusion 1031A is provided. That is, the light emitting region L1 has a symmetrical structure along the center line C2A. For example, as shown in FIG. 4B and FIG. 8D, the center line C1B of the two second protrusions 1031B in the column direction X in FIG. 8D coincides with the center line C2B (shown in FIG. 4B), along the column direction X, of the light emitting region L2 where the two second protrusions 1031B are provided. For example, as shown in FIG. 4C and FIG. 8D, the center line C1C of the two third protrusions 1031C and 1031D along the column direction X in FIG. 8D coincides with the center line C2C (shown in FIG. 4C), along the column direction X, of the light emitting regions L31 and L32 where the two third protrusions 1031C and 1031D are provided, respectively. Thus, the uniformity of the light luminance of the display substrate is ensured.

For example, in some embodiments, as shown in FIG. 8F, the value range of the width K2 of the effective light emitting region along the row direction Y is from 0.5 microns to 5 microns. For example, in the first sub-pixel P11, the value range of the width K21 of the effective light emitting region L11 along the row direction Y is, for example, approximately from 0.5 microns to 5 microns. For example, the value of the width K21 of the effective light emitting region L11 along the row direction Y is approximately 3.5 microns. For example, for the value of the width K22 of the effective light emitting region L12 of the second sub-pixel along the row direction Y, and the values of the widths K23 of the effective light emitting region L131 and the effective light emitting region L132 of the third sub-pixel along the row direction Y may refer to the value of the width K21 of the effective light emitting region L11 along the row direction Y, which will not be described in detail here.

For example, in some examples, as shown in FIG. 4A and FIG. 5, in the light emitting region L1 of the first sub-pixel P11, the effective light emitting region L11 of the first sub-pixel P11 surrounds the first insulation pattern sub-portion 1043A along the circumferential direction of the first insulation pattern sub-portion 1043A. For example, as shown in FIG. 4A, the light emitting region L1 has a hexagon shape, the orthographic projection of the first insulation pattern sub-portion 1043A has a hexagon shape and is in the central area of the light emitting region L1, and the effective light emitting region L11 is provided outside the edge of the first insulation pattern sub-portion 1043A and surrounds the edge of the first insulation pattern sub-portion 1043A. That is, the first opening 1041A of the first insulation layer 104 is a polygonal annulus surrounding the first insulation pattern sub-portion 1043A. In the circumferential direction of the first protrusion 1031A, the first protrusion 1031A and the portion of the second insulation layer 103 surrounding the edge of the light emitting region L1 of the first sub-pixel P11 is provided on two sides of the effective light emitting region L11, respectively. That is, the second opening 1032A of the second insulation layer 103 also forms a polygonal annulus surrounding the first protrusion 1031A. The first opening 1041A of the first insulation layer 104 is provided in the second opening 1032A of the second insulation layer 103.

For example, in other embodiments, the shape of the orthographic projection of the first insulation pattern sub-portion 1043A is designed as other shapes, which are not limited to the embodiments of the present disclosure.

For example, in some examples, as shown in FIG. 4A and FIG. 5, the light emitting region L1 of the first sub-pixel P11 extends along the column direction X, and the extending direction of the orthographic projection of the first protrusion 1031A on the main surface S of the base substrate 100 is same as the extending direction of the light emitting region L1 of the first sub-pixel P11. For example, the extending direction of the orthographic projection of the first insulation pattern sub-portion 1043A on the main surface S of the base substrate 100 is same as the extending direction of the light emitting region L1 of the first sub-pixel P11. Thus, the formed effective light emitting region L11 is a narrow strip surrounding the island region D1. The smaller the perimeter of the island region D1 and the width of the effective light emitting region L11, the more obvious the adjustment effect on the white-light color shift.

For example, in some embodiments, as shown in FIG. 4B and FIG. 6, the light emitting region L2 of the second sub-pixel P12 extends along the column direction X. The plurality of first protrusions 1031B are arranged at intervals along the column direction X. For example, the two first protrusions 1031B are arranged at intervals in the extending direction of the light emitting region L2. The effective light emitting region L12 of the second sub-pixel P12 surrounds the second insulation pattern sub-portions 1043B along the circumferential direction of the plurality of second insulation pattern sub-portions 1043B. For example, as shown in FIG. 4B, the light emitting region L2 has a hexagon shape, the orthographic projection of the second insulation pattern sub-portion 1043B is provided on the center line C2B of the light emitting region L2, and the orthographic projection of the second insulation pattern sub-portion 1043B has a pentagon shape. For example, the two second insulation pattern sub-portions 1043B are combined together to form a hexagon, which is equivalent to the case that the hexagon is separated by the effective light emitting region and thus the two second insulation pattern sub-portions 1043B are formed. The effective light emitting region L12 is provided outside the edge of the second insulation pattern sub-portion 1043B and surrounds the edge of the second insulation pattern sub-portion 1043B. That is, the first opening 1041B of the first insulation layer 104 is a narrow strip surrounding the second insulation pattern sub-portions 1043B. A portion of the effective light emitting region L12 (for example a portion provided between the two second insulation pattern sub-portions 1043B) passes through the spaces between the plurality of second protrusions 1031B. Thus, the island region D21 and the island region D22 are formed in the light emitting region L2, the area of the inclined side surface of the first electrode formed in the light emitting region L2 is increased, and the effect of improving the white-light color shift is further improved.

For example, in other embodiments, the shape of the orthographic projection of the second insulation pattern sub-portion 1043B is designed as other shapes, which is not limited to the embodiments of the present disclosure.

For example, in some examples, as shown in FIG. 4C and FIG. 7, in the two third sub-pixels (for example, the third sub-pixel P131 and the third sub-pixel P132) arranged at intervals in the column direction X, the third protrusions 1031C and 1031D are provided, respectively. The third insulation pattern sub-portion 1043C and the third insulation pattern sub-portion 1043D cover the third protrusion 1031C and the third protrusion 1031D, respectively. In the column direction X, the orthographic projections of the two third protrusions (the third protrusion 1031C and the third protrusion 1031D) on the main surface S of the base substrate 100 are adjacent to an interval region between the two third sub-pixels (for example, the third sub-pixel P131 and the third sub-pixel P132). As shown in FIG. 8D, the edge Y2C of the third protrusion 1031C is a non-closed geometry opening towards the third protrusion 1031D. The shape of the edge of the third protrusion 1031D is same as the shape of the edge Y2C of the third protrusion 1031C and orientated in an opposite direction. Likewise, in FIG. 8F, the shapes of the edges of the third insulation pattern sub-portions 1043C and 1043D are same as those of the third protrusions 1031C and 1031D, but the shapes are different in size.

For example, in some embodiments, as shown in FIG. 7, the two third protrusions (the third protrusion 1031C and the third protrusion 1031D) respectively in the two third sub-pixels (for example the third sub-pixel P131 and the third sub-pixel P132) are connected to and integral with the second insulation layer 103 in the interval region J1 between the two third sub-pixels. The third insulation pattern sub-portion 1043C and the third insulation pattern sub-portion 1043D are connected to and integral with the first insulation layer 104 in the interval region J1 between the two third sub-pixels. Thus, a protrusion with a larger area is provided as more as possible in the light emitting region of the third sub-pixel, so as to better improve the color shift.

It should be noted that, in the embodiments of the present disclosure, the structures of the light emitting region L131 of the third sub-pixel P131 and the light emitting region L132 of the third sub-pixel P132 are symmetrical with respect to the row direction Y. The embodiments of the present disclosure are not limited thereto, and the structures of the light emitting region L131 of the third sub-pixel P131 and the light emitting region L132 of the third sub-pixel P132 may be designed to be asymmetrical as required.

For example, in some embodiments, as shown in FIG. 4C and FIG. 7, the effective light emitting region of each third sub-pixel surrounds the edge of the third insulation pattern sub-portion provided in the light emitting region, and the effective light emitting region of each third sub-pixel has an arch shape. For example, the third sub-pixel P131 is taken as an example. The effective light emitting region L131 of the third sub-pixel P131 surrounds the edge of the third insulation pattern sub-portion 1043C, and the effective light emitting region L131 of the third sub-pixel P131 has an arch shape opening towards the third sub-pixel P132. Therefore, the perimeter of the island region D31 formed in the light emitting region of the third sub-pixel is larger, so as to better improve the color shift.

It should be noted that the embodiments of the present disclosure are not limited to the shapes of the light emitting region L1, the light emitting region L2, and the light emitting regions L31 and L32.

It should be noted that, in the embodiments of the present disclosure, according to the product requirements for the color gamut and white-light color shift, the number of sub-pixels provided with the island regions and in the plurality of pixel units P1 of the display substrate 1 may be adjusted.

For example, in some embodiments, a portion of the second insulation layer surrounding the edge of the effective light emitting region has a side surface, a tangent of the side surface intersects with the main surface of the base substrate, and the intersecting angle is the third angle α3.

For example, in some embodiments, the first electrode further has a second sub-portion covering the side surface of the second insulation layer; the tangent of the side surface at the edge of the second sub-portion intersects with the plane where the main surface of the base substrate is provided, the intersection angle is the fourth angle α4, and the third angle α3 and the fourth angle α4 are substantially same. The value range of the third angle α3 is from 40 degrees to 60 degrees.

The third angle α3 and the fourth angle α4 are described below by taking the structure of the first sub-pixel P11 as an example.

For example, as shown in FIG. 5, the portion of the second insulation layer 103 surrounding the edge of the light emitting region L1 has the side surface S2. The tangent of the side surface S2 intersects with the plane where the main surface S of the base substrate 100 is provided, and the intersecting angle is the third angle α3. That is, the side surface S2 is inclined relative to the base substrate 100, and the intersection angle is the angle between the side surface S2 and the main surface S of the base substrate 100 (for example, the angle is an acute angle here). By providing the inclined side surface S2 of the second insulation layer 103, it is possible to form a light output portion at the edge of the light emitting region, and thus the light output portion directs out the part of the light, which is emitted by the effective light emitting region and enters the first insulation layer 104, so as to increase the light efficiency.

For example, as shown in FIG. 5, the main body 111A of the first electrode 110 further has the second sub-portion 1112 covering the side surface S2 of the second insulation layer 103; the second sub-portion 1112 intersects with the plane where the main plane S of the base substrate 100 is provided, the intersection angle is the fourth angle α4. In the direction perpendicular to the main surface S of the base substrate 100, the second sub-portion 1112 of the first electrode 110 is provided between the side surface S2 of the second insulation layer 103 and the first insulation layer 104, and the third angle α3 and the fourth angle α4 are substantially same. Thus, the first electrode 110 is inclined to form a reflective cup structure at the edge of the light emitting region L1, and the reflective cup structure enables the light, which is emitted by the effective light emitting region L11, to change its propagation path by being reflected after entering the first insulation layer 104, so that the light is output to the light output surface of the display substrate; in this way, the light output efficiency of the first sub-pixel is increased, and at the same time, it is beneficial to achieve better the color gamut, and the white-light color shift of the display substrate.

For example, in some embodiments, the value range of the third angle α3 is, for example, approximately from 40 degrees to 60 degrees. For example, the value of the third angle α3 is approximately 55 degrees, so that the display substrate achieves a good balance in performances such as the light output efficiency, the color gamut and the white-light color shift, in order to meet product requirements. It should be noted that, the value range or the value of the fourth angle α4 may refer to the third angle α3.

For example, in some embodiments, the values of the first angle α1 and the third angle α3 of the edge of the first protrusion 1031A are as same as possible, so as to increase the uniformity of light emission. For example, in the case that the values of the first angle α1 and the third angle α3 are different, the value of the third angle α3 is closer to 55 degrees than the first angle α1, thus, it is more beneficial to adjust the white-light color shift.

It should be noted that, as shown in FIG. 6 and FIG. 7, the inclined structure same as that shown in FIG. 5 may be also provided at the edge of the light emitting region L2 of the second sub-pixel, as well as the edges of the light emitting region L31 and the light emitting region L32 of the third sub-pixel, which will not be described in detail here.

For example, in some examples, as shown in FIG. 4A, the distance between the edge of the first protrusion 1031A and the edge of the first insulation pattern sub-portion 1043A along the row direction Y is B2; for example, the value range of B2 is approximately from 2 microns to 3 microns, for another example, the value of B2 is approximately 2.5 microns. For example, the distance between the edge of the second insulation layer 103 close to the light emitting region L1 and the edge of the first insulation layer 104 close to the light emitting region L1 along the row direction Y is B1; for example, the value range of B1 is approximately from 2 microns to 3 microns, for another example, the value of B1 is approximately 2.5 microns. For example, the distance between the edge of the second insulation layer 103 close to the light emitting region L1 and the edge of the main body 111A of the first electrode 110 along the row direction Y is B3; for example, the value range of B3 is approximately from 1 micron to 2 microns, for another example, the value of B3 is approximately 1.5 microns. Thus, a better balance is achieved among the luminous efficiency, the color gamut, and the white-light color shift of the display substrate.

For example, in some examples, as shown in FIG. 4B, the distance between the edge of the second protrusion 1031B and the edge of the corresponding second insulation pattern sub-portion 1043B along the row direction Y is B6; for example, the value range of B6 is approximately from 2 microns to 3 microns, for another example, the value of B6 is approximately 2.5 microns. For example, the distance between the edge of the second insulation layer 103 close to the light emitting region L2 and the edge of the first insulation layer 104 close to the light emitting region L2 along the row direction Y is B4; for example, the value range of B4 is approximately from 2 microns to 3 microns, for another example, the value of B4 is approximately 2.5 microns. For example, the distance between the edge of the second insulation layer 103 close to the light emitting region L2 and the edge of the main body 111B of the first electrode 210 along the row direction Y is B5; for example, the value range of B5 is approximately from 1 micron to 2 microns, for another example, the value of B5 is approximately 1.5 microns. Thus, a better balance is achieved among the luminous efficiency, the color gamut, and the white-light color shift of the display substrate.

For example, in some examples, as shown in FIG. 4C, the distance between the edge of the third protrusion 1031D and the edge of the third insulation pattern sub-portion 1043D along the row direction Y is B8; for example, the value range of B8 is approximately from 2 microns to 3 microns, for another example, the value of B8 is approximately 2.5 microns. For example, the distance between the edge of the second insulation layer 103 close to the light emitting region L32 and the edge of the first insulation layer 104 close to the light emitting region L32 along the row direction Y is B9; for example, the value range of B9 is approximately from 2 microns to 3 microns, for another example, the value of B9 is approximately 2.5 microns. For example, the distance between the edge of the second insulation layer 103 close to the light emitting region L31 and the edge of the main body 111C of the first electrode 310 along the row direction Y is B7; for example, the value range of B7 is approximately from 1 micron to 2 microns, for another example, the value of B7 is approximately 1.5 microns. Thus, a better balance is achieved among the luminous efficiency, the color gamut, and the white-light color shift of the display substrate.

For example, in some examples, as shown in FIG. 8D, the maximum length of the edge Y2A of the first protrusion 1031A of the second insulation layer 103 along the column direction Y is B10; for example, the value range of B10 is approximately from 13 microns to 15 microns, for another example, the value of B10 is approximately 14 microns. The maximum length of the edge Y2B of the second protrusion 1031B of the second insulation layer 103 along the column direction Y is B11; for example, the value range of B11 is approximately from 5 microns to 7 microns, for another example, the value of B11 is approximately 6 microns. The maximum length of the edge Y2C of the third protrusion 1031C of the second insulation layer 103 along the column direction Y is B13; for example, the value range of B13 is approximately from 8.5 microns to 10.5 microns, for another example, the value of B13 is approximately 9.5 microns. The length of a side, along the column direction Y, of the edge Y2C of the third protrusion 1031C of the second insulation layer 103 is B12; for example, the value range of B12 is approximately from 7.6 microns to 8.4 microns, for another example, the value of B12 is approximately 8 microns. Thus, a better balance is achieved among the luminous efficiency, the color gamut, and the white-light color shift of the display substrate.

For example, in some examples, as shown in FIG. 8F, the maximum width of the second opening 1041A of the first insulation layer 104 in the column direction X is B14; for example, the value range of B14 is approximately from 5.5 microns to 6.5 microns, for another example, the value of B14 is approximately 6.1 microns. For example, the maximum width of the second opening 1041B of the first insulation layer 104 in the column direction X is B15; for example, the value range of B15 is approximately from 5.5 microns to 6.5 microns, for another example, the value of B15 is approximately 6.1 microns. For example, the portion of the second opening 1041B of the first insulation layer 104 provided between the two second insulation pattern sub-portions 1043B has a width B16 in the column direction X; for example, the value range of B16 is approximately from 4.5 microns to 5.5 microns, for another example, the value of B16 is approximately 5 microns. For example, the maximum width of the second opening 1041C of the first insulation layer 104 in the column direction X is B17; for example, the value range of B17 is approximately from 9 microns to 10.5 microns; for another example, the value of B17 is approximately 9.8 microns. Thus, a better balance is achieved among the luminous efficiency, the color gamut, and the white-light color shift of the display substrate.

For example, as shown in FIG. 5, the maximum thickness of the first protrusion 1031A is H1, and the maximum thickness of the portion of the second insulation layer 103 surrounding the light emitting region L1 (that is, the portion of the second insulation layer 103 outside the light emitting region L1) is H2.

For example, as shown in FIG. 5, the maximum thickness of the first insulation pattern sub-portion 1043A is H3, and the maximum thickness of the portion of the first insulation layer 104 surrounding the light emitting region L1 (that is, the portion of the first insulation layer 104 outside the light emitting region L1) is H4. For example, H3 is equal to H4. For example, the value range of H3 is approximately from 2.5 microns to 3.5 microns, for another example, the value of H3 is approximately 3 microns.

For example, as shown in FIG. 5, the first electrode layer AN includes a multi-layer structure; for example, the multi-layer structure is a three-layer lamination of indium tin oxide, silver and indium tin oxide (ITO/Ag/ITO). For example, the thickness of the indium tin oxide layer is approximately 8 nm, and the thickness of the silver layer is approximately 100 nm.

FIG. 8C is a plan view of a second conductive layer provided by at least one embodiment of the present disclosure.

For example, as shown in FIG. 5 and FIG. 8C, the display substrate 1 further includes a second conductive layer SD2. The second conductive layer SD2 is provided on the side of the second insulation layer 103 close to the base substrate 100. Each sub-pixel further includes a transition electrode (ZL1/ZL2/ZL31/ZL32), and the transition electrode (ZL1/ZL2/ZL31/ZL32) is provided in the second conductive layer SD2. The transition electrode (ZL1/ZL2/ZL31/ZL32) is connected to the sub-pixel driving circuit through a first via hole in the third insulation layer 105 and is connected to the first electrode through a second via hole in the second insulation layer 103. The transition electrode (ZL1/ZL2/ZL31/ZL32) includes a transparent conductive oxide material, such as an indium tin oxide material, so that neither the roughness of the second insulation layer 103 nor the flatness of the first electrode is affected during the fabrication of the second conductive layer SD2, thereby avoid of reducing the luminous efficiency.

For example, in some embodiments, an insulation layer, such as a buffer layer, is provided on the third insulation layer 105, and the buffer layer is provided between the second insulation layer 103 and the third insulation layer 105 to reduce the roughness of the second insulation layer 103. For example, the material of the insulation layer includes an insulation material, such as silicon oxide, silicon nitride, silicon oxynitride and the like.

For example, in some embodiments, the first electrode further includes an extension portion, the extension portion is correspondingly connected with both the main body portion of the first electrode and the second via hole, and the orthographic projection of the second via hole on the main surface of the base substrate does not overlap the orthographic projection of the light emitting region on the main surface of the base substrate. Thus, the flatness of the light emitting region of the sub-pixel is ensured.

For example, as shown in FIG. 5, FIG. 8B, FIG. 8C, FIG. 8D and FIG. 8E, in the first sub-pixel P11, the first sub-pixel P11 includes the transition electrode ZL1. The first electrode 110 includes the extension portion 112A. The transition electrode ZL1 is connected to the sub-pixel driving circuit 102A through the first via hole GK11 in the third insulation layer 105. The transition electrode ZL1 is connected to the extension portion 112A of the first electrode 110 through the second via hole GK21 in the second insulation layer 103. The extension portion 112A is connected to both the main body portion 111A of the first electrode 110 and the second via hole GK21. In FIG. 8D, the second via hole GK21 is provided at the lower left of the light emitting region L1. The extension portion 112A extends from the main body portion 111A of the first electrode 110 to the second via hole GK21. The orthographic projection of the second via hole GK21 on the main surface S of the base substrate 100 does not overlap the orthographic projection of the light emitting region L1 on the main surface S of the base substrate 100, so as to ensure the flatness of the light emitting region L1 of the first sub-pixel.

For example, as shown in FIG. 6, FIG. 8B, FIG. 8C, FIG. 8D and FIG. 8E, in the second sub-pixel P12, the second sub-pixel P12 includes the transition electrode ZL2. The first electrode 210 includes the extension portion 112B. The transition electrode ZL2 is connected to the sub-pixel driving circuit 102B through the first via hole GK12 in the third insulation layer 105. The transition electrode ZL2 is connected to the extension portion 112B of the first electrode 210 through the second via hole GK22 in the second insulation layer 103. The extension portion 112B is connected to both the main body portion 111B of the first electrode 210 and the second via hole GK22. In FIG. 8D, the second via hole GK22 is provided at the lower right of the light emitting region L2. The extension portion 112B extends from the main body portion 111B of the first electrode 210 to the second via hole GK22. The orthographic projection of the second via hole GK22 on the main surface S of the base substrate 100 does not overlap the orthographic projection of the light emitting region L2 on the main surface S of the base substrate 100, so as to ensure the flatness of the light emitting region L2 of the second sub-pixel.

For example, as shown in FIG. 7, FIG. 8B, FIG. 8C, FIG. 8D and FIG. 8E, in the third sub-pixel P131, the third sub-pixel P11 includes the transition electrode ZL31. The first electrode 310 includes the extension portion 112C. The transition electrode ZL31 is connected to the sub-pixel driving circuit 102C through the first via hole GK131 in the third insulation layer 105. The transition electrode ZL31 is connected to the extension portion 112C of the first electrode 310 through the second via hole GK231 in the second insulation layer 103. The extension portion 112C is connected to both the main body portion 111C of the first electrode 310 and the second via hole GK231. In FIG. 8D, the second via hole GK231 is provided at the lower left of the light emitting region L31. The extension portion 112C extends from the main body portion 111C of the first electrode 310 to the second via hole GK231. The orthographic projection of the second via hole GK231 on the main surface S of the base substrate 100 does not overlap the orthographic projection of the light emitting region L31 on the main surface S of the base substrate 100, so as to ensure the flatness of the light emitting region L31 of the third sub-pixel. The third sub-pixel P132 includes the transition electrode ZL32, the transition electrode ZL32, the extension portion 112D of the first electrode 410, the first via hole GK132, and the second via hole GK232 in the third sub-pixel P132 are respectively symmetrical with the transition electrode ZL31, the extension portion 112C of the first electrode 310, the first via hole GK131, and the second via hole GK231 in the third sub-pixel P131 about the row direction Y, which will not be described in detail here.

For example, as shown in FIG. 5, FIG. 6 and FIG. 7, the display substrate 1 further includes a barrier layer 1240, a buffer layer 1241, a first gate insulation layer 1242, a second gate insulation layer 1243, an interlayer insulation layer 1244, a semiconductor layer ACT, a first gate layer GT1, a second gate layer GT2 and a first conductive layer SD1. The barrier layer 1240 is provided on the main surface S of the base substrate 100. The buffer layer 1241 is provided on the side of the barrier layer 1240 facing away from the base substrate 100. The buffer layer 1241 serves as a transition layer, which not only prevents harmful substances in the base substrate from intruding into the interior of the display substrate, but also increases the adhesion between the layers and the base substrate 100 in the display substrate. The barrier layer 1240 provides a flat surface for forming the pixel driving circuit 103 and prevents impurities that may exist in the base substrate 100 from diffusing into the sub-pixel driving circuit or the pixel driving circuit 103 and adversely affecting the performance of the display substrate.

For example, the material of the buffer layer 1241 includes an insulation material such as silicon oxide, silicon nitride, silicon oxynitride and the like. For example, the material of the barrier layer 1240 includes an inorganic insulation material such as silicon oxide, silicon nitride, silicon oxynitride and the like, or includes other suitable materials.

For example, the first gate insulation layer 1242 is provided on a side of the buffer layer 1241 facing away from the base substrate 100. The semiconductor layer ACT is provided between the first gate insulation layer 1242 and the buffer layer 1241. The second gate insulation layer 1243 is provided on a side of the first gate insulation layer 1242 facing away from the base substrate 100. The first gate layer GT1 is provided between the first gate insulation layer 1242 and the second gate insulation layer 1243. The interlayer insulation layer 1244 is provided on a side of the second gate insulation layer 1243 facing away from the base substrate 100. The second gate layer GT2 is provided between the second gate insulation layer 1243 and the interlayer insulation layer 1244. The first conductive layer SD is provided on a side of the interlayer insulation layer 1244 facing away from the base substrate 100.

FIG. 8A is a plan view of a first conductive layer provided by at least one embodiment of the present disclosure.

For example, FIG. 8A shows at least the following structures: the portion of the sub-pixel driving circuit 102A of the first sub-pixel connected to the transition electrode ZL1, the portion of the sub-pixel drive circuit 102B of the second sub-pixel connected to the transition electrode ZL2, the portion of the sub-pixel driving circuit 102C of the third sub-pixel connected to the transition electrode ZL31, and the portion of the sub-pixel driving circuit 102D of the third sub-pixel connected to the transition electrode ZL32. It should be noted that, other wirings or structures in the first conductive layer SD1 will not be described in detail here.

For example, the material of one or more of the first gate insulation layer 1242, the second gate insulation layer 1243, and the interlayer insulation layer 1244 includes an insulation material such as silicon oxide, silicon nitride, silicon oxynitride and the like. The materials of the first gate insulation layer 1242, the second gate insulation layer 1243 and the interlayer insulation layer 1244 may be the same or different.

For example, the material of the semiconductor layer ACT includes polysilicon or an oxide semiconductor (for example indium gallium zinc oxide (IGZO)).

For example, the materials of the first gate layer GT1, the second gate layer GT2 and the first conductive layer SD1 includes a metal material or an alloy material, such as a metal single-layer or multi-layer structure formed by molybdenum, aluminum, titanium and the like; for example, the multi-layer structure is a multi-layer metal lamination (for example a three-layer metal lamination (Ti/Al/Ti) formed by titanium, aluminum, and titanium). For example, the materials of the first gate layer GT1, the second gate layer GT2, and the first conductive layer SD1 may be the same or different, and the embodiments of the present disclosure are not limited thereto.

For example, as shown in FIG. 5, FIG. 6 and FIG. 7, the display substrate 1 further includes an encapsulation layer 147 and a spacer 117. The spacer 117 is provided on the side of the first insulation layer 104 facing away from the base substrate 100, that is, the spacer 117 is provided between the first insulation layer 104 and the second electrode 130. The encapsulation layer 147 is provided on a side of the second electrode 130 facing away from the base substrate 100. The encapsulation layer 147 seals the light emitting element, so that deterioration of the light emitting element caused by moisture and/or oxygen in the environment is reduced or prevented. The encapsulation layer 147 may be a single-layer structure, or a composite-layer structure; and the composite-layer structure includes a structure in which an inorganic layer and an organic layer are laminated. The encapsulation layer 147 includes at least one encapsulation sub-layer. For example, the encapsulation layer 147 includes a first inorganic encapsulation sub-layer, a first organic encapsulation sub-layer, and a second inorganic encapsulation sub-layer arranged in sequence.

For example, the material of spacer 117 includes a transparent insulation material.

For example, the material of the encapsulation layer 147 includes an insulation material such as silicon nitride, silicon oxide, silicon oxynitride, polymer resin and the like. The inorganic material, such as silicon nitride, silicon oxide, silicon oxynitride and the like, has high compactness and thus prevents the intrusion of water and oxygen; the material of the organic encapsulation layer is a polymer material containing a desiccant or a polymer material that blocks water vapor, such as a polymer resin, which planarizes the surface of the display substrate, relieves the stress of the first inorganic encapsulation layer and the second inorganic encapsulation layer, or includes a water-absorbing material such as an desiccant to absorb an intruding substance, such as water or oxygen.

For example, as shown in FIG. 5, the sub-pixel driving circuit 102A includes a first transistor 12 and a storage capacitor 13. The first transistor 13 includes a transistor that is directly electrically connected to the light emitting element 101A, and the transistor is, for example, a switching transistor (for example a light-emitting control transistor) or a driving transistor. The first transistor 12 includes a gate electrode 122, two source-drain electrodes (a source electrode 123 and a drain electrode 124), and an active layer 121. The gate electrode 122 is provided in the first gate layer GT1, the two source-drain electrodes (the source electrode 123 and the drain electrode 124) are provided in the first conductive layer SD1, and the active layer 121 is provided in the semiconductor layer ACT. The storage capacitor 13 includes a first electrode plate 131 and a second electrode plate 132. For example, the first electrode plate 131 is provided in the first gate electrode layer GT1, and the second electrode plate 132 is provided in the second gate electrode layer GT2. The gate electrode 122 and the first electrode plate 131 are disposed in the same layer. The second gate insulation layer 1243 is between the first electrode plate 131 and the second electrode plate 132 to achieve capacitance function.

It should be noted that, in FIG. 6, the sub-pixel driving circuit 102B includes a first transistor 22 and a storage capacitor 23. The first transistor 22 includes a gate electrode 222, two source-drain electrodes (a source electrode 223 and a drain electrode 224), and an active layer 221. The storage capacitor 23 includes a first electrode plate 231 and a second electrode plate 232. The structures of the first transistor 22 and the storage capacitor 23 refers to those of the first transistor 12 and the storage capacitor 13 in FIG. 5, which will not be described in detail here. In FIG. 7, the sub-pixel drive circuit 102C includes a first transistor 32 and a storage capacitor 33. The first transistor 32 includes a gate electrode 322, two source-drain electrodes (a source electrode 323 and a drain electrode 324), and an active layer 321. The storage capacitor 33 includes a first electrode plate 331 and a second electrode plate 332. The structures of the first transistor 32 and the storage capacitor 33 refer to the first transistor 12 and the storage capacitor 13 in FIG. 5, which will not be described in detail here. The sub-pixel driving circuit 102D includes a first transistor 42 and a storage capacitor 43. The first transistor 42 includes a gate electrode 422, two source-drain electrodes (a source electrode 423 and a drain electrode 424), and an active layer 421. The storage capacitor 43 includes a first electrode plate 431 and a second electrode plate 432. The structures of the first transistor 42 and the storage capacitor 43 refer to the first transistor 12 and the storage capacitor 13 in FIG. 5, which will not be described in detail here.

It should be noted that, in the embodiments of the present disclosure, the sub-pixel driving circuit (102A/102B/102C/102D) includes a 2T1C (that is, two transistors and one capacitor) pixel circuit, a 7T1C (that is, seven transistors and one capacitor) pixel circuit, or the like. The sub-pixel drive circuit includes at least one switch transistor and at least one drive transistor (the first transistor 12 shown in FIG. 5), the gate electrode of the switch transistor receives a gate scan signal, and the source electrode or drain electrode of the switch transistor is connected to a data line to receive a data signal. In other different embodiments, the sub-pixel driving circuit (102A/102B/102C/102D) further includes a compensation circuit, the compensation circuit includes an internal compensation circuit or an external compensation circuit, and the compensation circuit includes a transistor, a capacitor, and the like. For example, according to requirements, the pixel circuit further includes a reset circuit, a light emitting control circuit, a detection circuit, and the like. The embodiments of the present disclosure do not limit the type of the first light emitting device and the specific structure of the pixel circuit.

Figure 9A:
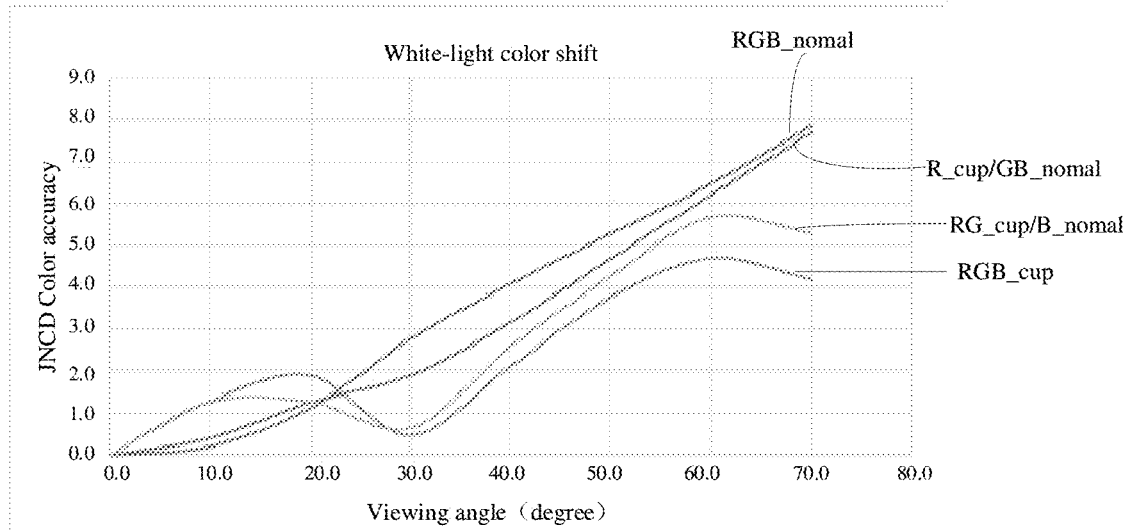
FIG. 9A is a curve graph showing a white-light color shift changed with a viewing angle of the display substrate provided by at least one embodiment of the present disclosure.
Figure 9B:
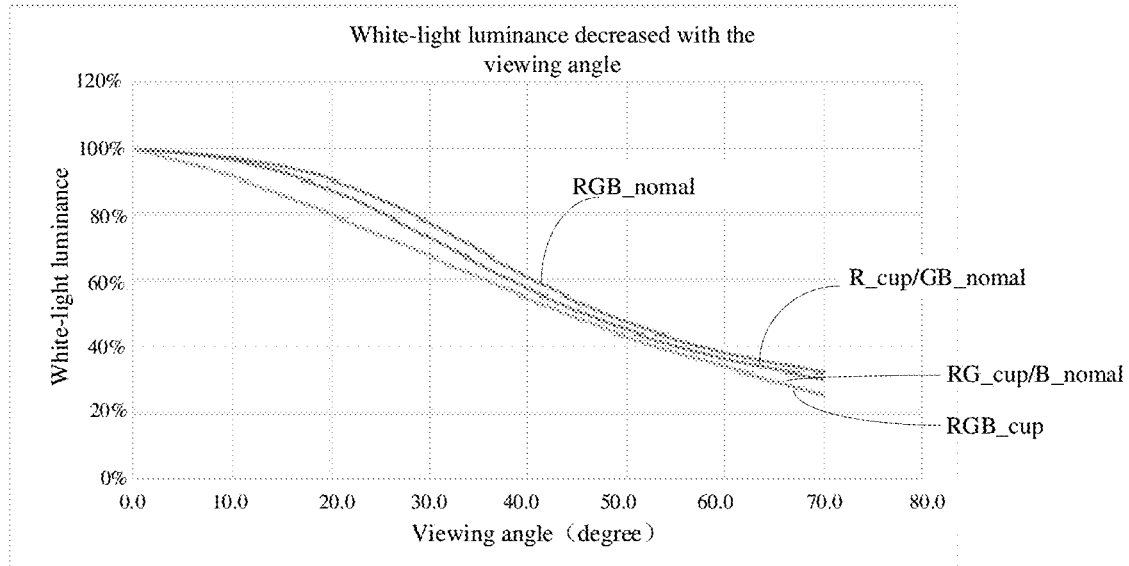
FIG. 9B is a curve graph showing a white-light luminance decreased with a viewing angle of the display substrate according to at least one embodiment of the present disclosure.

FIG. 9A is a curve graph showing a white-light color shift changed with a viewing angle of the display substrate provided by at least one embodiment of the present disclosure. FIG. 9B is a curve graph showing a white-light luminance decreased with a viewing angle of a display substrate according to at least one embodiment of the present disclosure.

For example, in some embodiments, the sizes of the light emitting region, the effective light emitting region, the protrusion, and the insulation pattern sub-portion provided in each sub-pixel of the display substrate 1 are designed according to the performance requirements such as the luminance, the color gamut, the white-light color shift and so on. For example, the larger the perimeter of the reflective cup structure at the edge of the light emitting region and the larger the number and perimeter of the edges of the protrusion (that is, the number of island region in the light emitting region is more and the perimeter thereof is larger), the smaller the light sensitivity of the corresponding sub-pixel and the further the light displayed by the base substrate 1 deviates from the light of the sub-pixel.

For example, Table 1 shows the parameters of the color coordinate and the NTSC (Just Noticeable Color Difference) color gamut (for example a sum of the colors under the NTSC standard) in four design schemes. The four design schemes are respectively as below: the red sub-pixel R, the green sub-pixel G and blue sub-pixel B are not provided with the island region and the reflective cup structure around the light emitting region (RGB_nomal); the red sub-pixel R is provided with the structure shown in FIG. 3, while the green sub-pixel G and the blue sub-pixel B are not provided with the island region and the reflective cup structure around the light emitting region (R_cup/GB_normal); the red sub-pixel R and the green sub-pixel G each is provided with the structure shown in FIG. 3, while the blue sub-pixel B is not provided with the island region and the reflective cup structure around the light emitting region (RG_cup/B_normal); the red sub-pixel R, the green sub-pixel G, and the blue sub-pixel B each is provided with the structure (RGB_cup) shown in FIG. 3.

TABLE 1

|  | Rx | Ry | Gx | Gy | Bx | By | NTSC (color gamut) | W eff (white light efficiency) |
| --- | --- | --- | --- | --- | --- | --- | --- | --- |
| RGB_nomal | 0.6711 | 0.3286 | 0.2439 | 0.7029 | 0.1397 | 0.0498 | 101% | 100% |
| R_cup/GB_normal | 0.6681 | 0.3317 | 0.2439 | 0.7029 | 0.1397 | 0.0498 | 100% | 104.4% |
| RG_cup/B_normal | 0.6681 | 0.3317 | 0.2603 | 0.6876 | 0.1397 | 0.0498 | 96% | 108.1% |
| RGB_cup | 0.6681 | 0.3317 | 0.2603 | 0.6876 | 0.1392 | 0.0581 | 95% | 109% |

For example, FIG. 9A shows a curve graph of the white-light color shift changed with a viewing angle for the above four schemes. FIG. 9B is a curve graph showing a white-light luminance decreased with a viewing angle for the above four schemes. Referring to the data in Table 1 and the curves shown in FIG. 9A and FIG. 9B, it can be seen that: in the case that the red sub-pixel R, the green sub-pixel G, and the blue sub-pixel B are not provided with the island region and the reflective cup structure around the light emitting region (RGB_nomal), the value of the NTSC color gamut is the largest; in the case that the red sub-pixel R, the green sub-pixel G, and the blue sub-pixel B each is provided with the structure shown in FIG. 3 (RGB_cup), the value of the white light efficiency is the largest, that is, the white-light color shift is small. Thus, it is concluded that the requirements of the product for the color gamut and white-light color shift is met by providing the island region in the light emitting region of the sub-pixel and providing the reflective cup at the edge of the light emitting region. For example, the white-light color shift is reduced by increasing the number of island regions, the perimeter of the edge of the island region, or the perimeter of the reflective cup. For example, the color gamut is increased by reducing the number of island regions, the perimeter of the edge of the island region, or the perimeter of the edge of the reflective cup. By using the above manner, the display substrate achieves a better balance in performances such as the color gamut and white-light color shift.

Figure 10:
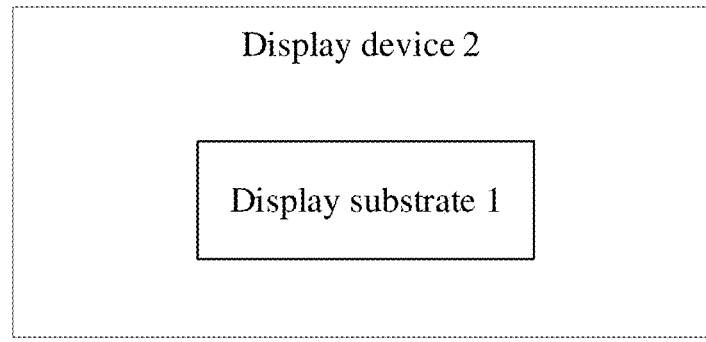
FIG. 10 is a schematic view of a display device provided by at least one embodiment of the present disclosure.

At least one embodiment of the present disclosure further provides a display device. FIG. 10 is a schematic view of a display device according to at least one embodiment of the present disclosure.

As shown in FIG. 10, the display device 2 includes the display substrate 1 provided by any one of the embodiments of the present disclosure, for example, the display substrate 1 shown in FIG. 2.

It should be noted that the display device 2 may be any product or component with a display function, such as an OLED panel, an OLED TV, a QLED panel, a QLED TV, a mobile phone, a tablet computer, a laptop computer, a digital photo frame, a navigator and the like. The display device 2 for example further includes other components, such as a data driving circuit, a timing controller, etc., which are not limited in the embodiments of the present disclosure.

It should be noted that, for the sake of clarity and conciseness, the embodiments of the present disclosure do not provide all the constituent components of the display device. In order to realize substrate function of the display device, those skilled in the art may provide or dispose other structures not shown according to specific needs, which are not limited by the embodiments of the present disclosure.

Regarding the technical effects of the display device 2 provided in the above embodiments, reference may be made to the technical effects of the display substrate 1 provided in the embodiments of the present disclosure, which will not be repeated here.

The following should be noted:

(1) The drawings of the embodiments of the present disclosure involves only the structure(s) in connection with the embodiment(s) of the present disclosure, and other structure(s) may be referred to common design(s).

(2) In case of no conflict, features in one embodiment or in different embodiments can be combined as a new embodiment.

The above are only specific embodiments of the present disclosure, but the protection scope of the present disclosure is not limited thereto. Any skilled person familiar with the technical field may easily constructs changes or substitutions within the technical scope disclosed in the present disclosure, and these variations or substitutions should be covered by the protection scope of the present disclosure. Therefore, the protection scope of the present disclosure should be based on the protection scope of the claims.

The invention claimed is:

1. A display substrate, comprising:
    a base substrate, comprising a display region, wherein the display region comprises a plurality of pixel units arranged in a plurality of rows and a plurality of columns, each of the pixel units comprises a plurality of sub-pixels, each of the sub-pixels comprises a light emitting element and a sub-pixel driving circuit, the light emitting element comprises a first electrode, a second electrode and a light emitting layer, the first electrode is provided on the base substrate, the second electrode is provided on a side of the first electrode facing away from the base substrate, and the light emitting layer is provided between the first electrode and the second electrode; and
    a first insulation layer, provided between the first electrode and the light emitting layer, wherein the first insulation layer comprises a plurality of first openings, and the plurality of first openings are in one-to-one correspondence with the plurality of sub-pixels, each of the plurality of first openings is configured to expose the first electrode to form an effective light emitting region of the light emitting element, at least one effective light emitting region at least partially surrounds at least one island region;
    wherein the first insulation layer comprises a first insulation pattern, a second insulation pattern is provided on a side of the first electrode close to the base substrate, the second insulation pattern, the first electrode, the first insulation pattern, the light emitting layer and the second electrode are sequentially provided in the island region along a direction facing away from the base substrate, a distance between a portion of the first electrode in the island region and a main surface of the base substrate in a direction perpendicular to the main surface of the base substrate is greater than a distance between a portion of the first electrode in the effective light emitting region and the main surface of the base substrate in the direction perpendicular to the main surface of the base substrate.

2. The display substrate according to claim 1, further comprising: a second insulation layer, wherein
    the second insulation layer is provided on the side of the first electrode close to the base substrate;
    an orthographic projection of the first insulation pattern on the main surface of the base substrate at least partially overlaps an orthographic projection of the second insulation pattern on the main surface of the base substrate;
    the first insulation layer and the first insulation pattern are provided in a same layer using a same material, and the second insulation layer and the second insulation pattern are provided in a same layer using a same material.

3. The display substrate according to claim 2, wherein
    the second insulation layer has a second opening corresponding to the effective light emitting region, and the second opening is provided between an edge of the second insulation layer surrounding the effective light emitting region and an edge of the second insulation pattern;
    a thickness, in the direction perpendicular to the main surface of the base substrate, of a portion of the second insulation layer in a region where a bottom of the second opening is provided is zero, or the thickness is greater than zero and smaller than a thickness of the second insulation pattern in the direction perpendicular to the main surface of the base substrate.

4. The display substrate according to claim 2, further comprising: a third insulation layer, wherein
    the third insulation layer is provided on a side of the second insulation layer close to the base substrate, the third insulation layer has a third insulation pattern in the island region;
    a distance between the third insulation pattern and the main surface of the base substrate in the direction perpendicular to the main surface of the base substrate is greater than a distance between a portion of the third insulation layer in the effective light emitting region and the main surface of the base substrate in the direction perpendicular to the main surface of the base substrate.

5. The display substrate according to claim 4, wherein a thickness, in the direction perpendicular to the main surface of the base substrate, of the portion of the third insulation layer in the effective light emitting region is smaller than a thickness of a portion of the third insulation layer surrounding the effective light emitting region in the direction perpendicular to the main surface of the base substrate.

6. The display substrate according to claim 2, wherein
    the second insulation pattern has a side surface provided at an edge of the second insulation pattern, a tangent of the side surface intersects with a plane where the main surface of the base substrate is provided, and an intersection angle is a first angle $\alpha 1$;
    the first electrode has a first sub-portion covering the second insulation pattern;

a tangent of a side surface at an edge of the first sub-portion intersects with the plane where the main surface of the base substrate is provided, an intersection angle is a second angle α2, and the second angle α2 is substantially equal to the first angle α1;

a value range of the first angle α1 is from 15 degrees to 70 degrees.

7. The display substrate according to claim 6, wherein the first insulation pattern comprises at least one insulation pattern sub-portion separated from each other, and the second insulation pattern comprises at least one protrusion;

the at least one insulation pattern sub-portion covers at least a portion of the at least one protrusion respectively, and an orthographic projection of the at least one protrusion on the main surface of the base substrate overlaps both an orthographic projection of the at least one insulation pattern sub-portion on the main surface of the base substrate and an orthographic projection of the first sub-portion on the main surface of the base substrate.

8. The display substrate according to claim 7, wherein the orthographic projection of the at least one protrusion on the main surface of the base substrate is within the orthographic projection of the at least one insulation pattern sub-portion on the main surface of the base substrate;

in a circumferential direction of the orthographic projection of the at least one protrusion on the main surface of the base substrate, a distance between an edge of the orthographic projection of the at least one insulation pattern sub-portion on the main surface of the base substrate and an edge of the orthographic projection of the at least one protrusion on the main surface of the base substrate is substantially same.

9. The display substrate according to claim 7, wherein in the direction perpendicular to the main surface of the base substrate, the at least one protrusion has a maximum thickness H1, a portion of the second insulation layer surrounding the effective light emitting region has a maximum thickness H2, and H1<H2;

the maximum thickness H1 of the at least one protrusion ranges from 0.5 microns to 3 microns.

10. The display substrate according to claim 9, wherein the plurality of sub-pixels of the pixel unit are arranged in a row direction, and a maximum size, in the row direction, of the at least one protrusion is greater than or equal to H1/tan(α1).

11. The display substrate according to claim 9, wherein a distance between an edge of the orthographic projection of the at least one protrusion on the main surface of the base substrate in the row direction and an edge of an orthographic projection of a corresponding effective light emitting region on the main surface of the base substrate in the row direction is substantially same.

12. The display substrate according to claim 7, wherein the plurality of sub-pixels of each of the pixel units comprises a first sub-pixel, a second sub-pixel and at least one third sub-pixel, the second insulation pattern comprises a first protrusion provided in the first sub-pixel, the first insulation pattern comprises a first insulation pattern sub-portion covering the first protrusion, and the effective light emitting region of the first sub-pixel surrounds the first insulation pattern sub-portion along an circumferential direction of the first insulation pattern sub-portion;

a shape of a profile of an orthographic projection of the first protrusion on the main surface of the is substantially same as a shape of a profile of an orthographic projection of an edge, facing away from the first protrusion, of the effective light emitting region of the first sub-pixel on the main surface of the base substrate.

13. The display substrate according to claim 12, wherein a maximum size of the effective light emitting region of the first sub-pixel in the column direction is greater than the maximum size thereof in the row direction, a maximum size of the first protrusion of the first sub-pixel in the column direction is greater than the maximum size thereof in the row direction, and a distance between an edge of the orthographic projection of the first protrusion on the main surface of the base substrate in the column direction and an edge of an orthographic projection of a corresponding effective light emitting region on the main surface of the base substrate in the column direction is substantially same.

14. The display substrate according to claim 12, wherein the second insulation pattern further comprises a plurality of second protrusions provided in the second sub-pixel, a maximum size of the effective light emitting region of the second sub-pixel along the column direction is larger than a maximum size of the effective light emitting region of the second sub-pixel along the row direction, the plurality of second protrusions are arranged at intervals along the column direction;

the first insulation pattern further comprises second insulation pattern sub-portions covering the plurality of second protrusions respectively, and the effective light emitting region of the second sub-pixel surrounds the second insulation pattern sub-portion along a circumferential direction of the second insulation pattern sub-portion;

the effective light emitting region comprises portions provided between the plurality of second protrusions.

15. The display substrate according to claim 12, wherein the at least one third sub-pixel comprises two third sub-pixels spaced from each other in the column direction, and the second insulation pattern further comprises a third protrusion in each third sub-pixel, the first insulation pattern further comprises a third insulation pattern sub-portion covering the third protrusion;

the effective light emitting region of the third sub-pixel surrounds a part of an edge of the third protrusion, and the effective light emitting region of the third sub-pixel has a notch, and an orthographic projection of the notch on the main surface of the base substrate at least partially overlaps an orthographic projection of the third protrusion on the main surface of the base substrate.

16. The display substrate according to claim 15, wherein the third protrusions in the two third sub-pixels are connected and integral with the second insulation layer in an interval region provided between the two third sub-pixels, the third insulation pattern sub-portion is connected and integral with the first insulation layer in the interval region between the two third sub-pixels.

17. The display substrate according to claim 15, wherein the notches of the effective light emitting regions of the two third sub-pixels are respectively provided at adjacent edges of the two third sub-pixels, and the notches are substantially symmetrical about a line extending in the row direction.

18. The display substrate according to claim 12, wherein the first sub-pixel is a red sub-pixel, the second sub-pixel is a blue sub-pixel, and the third sub-pixel is a green sub-pixel pixel;

at least one island region is provided in the first sub-pixel, and the island region is not provided in the second sub-pixel and the third sub-pixel.

19. The display substrate according to claim 2, wherein
a portion of the second insulation layer surrounding an edge of the effective light emitting region has a side surface, and a tangent of the side surface intersects with a plane where the main surface of the base substrate is provided, and an intersecting angle is a third angle $\alpha 3$;

the first electrode further has a second sub-portion covering the side surface of the second insulation layer, and a tangent of the second sub-portion intersects with the plane where the main surface of the base substrate is provided, and an intersection angle is a fourth angle $\alpha 4$;

the third angle $\alpha 3$ is substantially same as the fourth angle $\alpha 4$;

the third angle $\alpha 3$ ranges from 40 degrees to 60 degrees.

20. A display device comprising the display substrate according to claim 1.

* * * * *